(12) United States Patent
Banihashemi et al.

(10) Patent No.: US 7,769,798 B2
(45) Date of Patent: Aug. 3, 2010

(54) FULL CMOS MIN-SUM ANALOG ITERATIVE DECODERS

(76) Inventors: Amir Banihashemi, 3843 Marble Canyon, Gloucester, Ontario (CA) K1V 1P8; Saied Hemati, #1801, 1375 Prince of Wales Drive, Ottawa, Ontario (CA) K2C 3L5

( * ) Notice: Subject to any disclaimer, the term of this patent is extended or adjusted under 35 U.S.C. 154(b) by 1863 days.

(21) Appl. No.: 10/832,806

(22) Filed: Apr. 27, 2004

(65) Prior Publication Data

US 2005/0240647 A1 Oct. 27, 2005

(51) Int. Cl.
*G06G 7/00* (2006.01)
(52) U.S. Cl. ............. 708/801; 708/207; 708/800
(58) Field of Classification Search ............. 708/207, 708/800, 801
See application file for complete search history.

(56) References Cited

U.S. PATENT DOCUMENTS

| | | | | |
|---|---|---|---|---|
| 4,983,929 | A * | 1/1991 | Real et al. | 330/288 |
| 5,059,814 | A * | 10/1991 | Mead et al. | 706/33 |
| 5,703,503 | A * | 12/1997 | Miyamoto et al. | 327/58 |
| 6,118,307 | A * | 9/2000 | Shi et al. | 327/58 |
| 6,271,693 | B1 * | 8/2001 | Shi et al. | 327/99 |
| 6,362,662 | B1 * | 3/2002 | Shi et al. | 327/63 |
| 2007/0276895 | A9 * | 11/2007 | Winstead et al. | 708/490 |

OTHER PUBLICATIONS

Banihashemi, Amir & Zarkeshvari, Farhad. On Implementation of Min-Sum algorithm for Decoding Low-Density Parity Check (LDPC) Codes. IEEE 2002, pp. 1349-1352.

Johns, et al. High Speed CMOS Analog Viterbi Detector for 4-PAM Partial-Response Signaling. IEE Journal of Solid State Circuits, vol. 37, No. 7. Jul. 2002, p. 895-903.

Xotta, Andrea et al. An All-Analog CMOS Implementation of a Turbo Decoder for Hard-Disk Drive Read Channels, IEEE 2002, p. 69-72.

Xotta, A., et al., CMOS Implementation of All-Analogue APP Decoders: Analysis of Performances and Limitations. Electronics Letters, vol. 37, No. 26, Dec. 2001, p. 1501-1503.

Shakiba, Mohammad Hossein & Johns, David, A. BiCMOS Circuits for Analog Viterbi Decoders. IEEE Transactions on Circuits and Systems—II: Analog and Digital Signal Processing, vol. 45, No. 12. Dec. 1998 pp. 1527-1537.

(Continued)

*Primary Examiner*—Lewis A Bullock, Jr.
*Assistant Examiner*—Michael Yaary
(74) *Attorney, Agent, or Firm*—McDonnell Boehnen Hulbert & Berghoff LLP

(57) ABSTRACT

Analog iterative decoders are provided that are based on the so-called min-sum algorithm (also referred to as max-sum or max-product, Max-Log-MAP or BP-based decoding) and can be used to decode powerful coding schemes such as low-density parity-check (LDPC) codes and turbo codes. The circuits can be implemented by standard CMOS technology, which means lower fabrication cost and/or simpler design compared to previously reported analog iterative decoders that are based on BiCMOS or sub-threshold CMOS technology. Soft information is passed among variable nodes and parity-check nodes. A low-voltage high-swing Max WTA circuit is also provided. The circuit can be implemented by short channel MOSFET transistors and yet provide a reasonably high degree of accuracy. Applications include soft computing, and analog signal processing, in general. A Min WTA circuit can also be built based on this circuit by subtracting the input currents from a large reference current.

21 Claims, 16 Drawing Sheets

OTHER PUBLICATIONS

Prodanov, V.I. & Green, M.M. CMOS Current Mirrors with Reduced Input and Output Voltage Requirements. Electronics Letters, vol. 32, No. 2 Jan. 1996, p. 104-105.

Perenzoni, Matteo et al., Analog CMOS Implementation of Gallagher's Iterative Decoding Algorithm Applied to a Block Turbo Code. IEEE 2003, p. 813-816.

Opris, Ion E., Rail to Rail Multiple Input Min/Max Circuit. IEEE Transactions on Circuits and System—I: Fundamental Theory and Applications, vol. 44, No. 12 Dec. 1997, p. 1114-1121.

Opris, Ion E., Analog Rnat Extractors. IEEE Transactions on Circuits and Systems—I: Fundamental Theory and Applications, vol. 44, 1997 p. 1114-1121.

Lustenberger, Felix et al. An Analogue VLSI Decoding Technique for Digital Codes. IEEE 1999, p. 424-427.

Loeliger, Hans-Andrea et al. Decoding in Analog VLSI. IEEE Communications Magazine. Apr. 1999, p. 99-101.

Loeglier, Hans-Andrea et al. Probability Propagation and Decoding in Analog in VLSI. IEEE ISIT 1998, p. 146.

Frey, Matttias et al. Analog-Decoder Experiments with Subthreshold CMOS Soft-Gates. IEEE 2003, p. 85.88.

Loeliger, Hans-Andrea. Analog Decoding and Beyond. IEEE ITW 2001, p. 126-127.

Lustenberger, Felix & Loeliger, Hans-Andrea. On Mismatch Errors in Analog-VLSI Error Correcting Decoders. IEEE 2001, p. 198-201.

Loeliger, Hans-Andrea et al. Probability Propagation and Decoding in Analog VLSI. IEEE Transactions on Information Theory, vol. 47, No. 2 2001, p. 837-843.

Hemati, Saied & Banihashemi, Amir H. Full CMOS Min-Sum Analog Iterative Decoder, IEEE ISIT, 2003, p. 347.

Hagenauer, Joachim & Winkihofer, Max. The Analog Decoder. IEEE ISIT Aug. 1998, p. 145.

Hagenauer, Joachim et al. Analog Decoders and Receivers for High Speed Applications. International Zurich Seminar on Broadband Communications—Access, Transmission, Networking. Feb. 2002, p. 1-8.

Moerz, Matthias et al. Analog Decoders for High Rate Convlutional Codes. IEEE ITW 2001. Sep. 2001, p. 128-133.

Hagenauer, Joachim et al. An All-Analog Ring Network for Turbo-Detection of Convolutionally Encoded DPSK Signals. IEEE, ISIT 2000. Jun. 2000 p. 422.

Moorz, Matthias et al. WA 21.5 An Analog 0.25 um BiCMOS Tailbiting MAP Decoder. IEEE International Solid State Circuits Conference. Jun. 2000 p. 425.

Schaefer, Andrew et al. Analog Rotating Ring Decoder for an LDPC Convolutional Code. IEEE ITW2003. Apr. 2003, p. 226-229.

El-Masry, Ezz & Maundy, Brent. A Novel Current Mode Winner Take All Circuit for Artificial Neural Networks. p. 2466-2469.

Winstead, Chris et la. CMOS Analog MAP Decoder for (8,4) Hamming Code. IEEE Journal of Solid State Circuits, vol. 39, No. 1. Jan. 2004, p. 122-131.

Winstead, Chris et al. Gaudet, Vincent C. & Schlegel, Christian. Analog Iterative Decoding of Error Control Codes. IEEE CCECE 2003-CCGEI 2003. May 2003, p. 1539-1542.

Winstead, Chris & Schlegel, Christian. Importance Sampling for SPICE-level verification of Analog Decoders. IEEE ISIT 2003, Jun. 2003. p. 103.

Dai, Jie et al. Cell Library for Automatic Synthesis of Analog Error Control Decoders. IEEE 2002, p. 481-484.

Winstead, Chris et al. Analog Decoding of Product Codes, IEEE ISIT 2002, Jun. 2002, p. 230.

Winstead, Chris et al. Analog Decoding of Product Codes. IEEE ITW2001 Sep. 2001, p. 131-133.

Winstead, Chris et al. Analog MAP Decoder for (8,4) Hamming Code in Subthreshold CMOS. IEEE ISIT2001. Jun. 2001, p. 330.

Winstead, Chris et al. Analog MAP Decoder for (8,4) Hamming Code in Subthreshold CMOS. IEEE 2001, p. 132-147.

Amat, A. Graell i. et al., An analog Decoder for Concatenated Magnetic Recording Schemes. IEEE 2002, p. 1563-1568.

Mondragon-Torres, Antonio et al. Floating-Gate Analog Implementation of the Additive Soft-Input Soft-Output Decoding Algorithm. IEEE Transactions on Circuits and Systems-I: Fundamental Theory and Applications, vol. 50, No. 10, 2003 p. 1256-1269.

Omole, Ibiyemi A. & Maundy, Brent J. Versatile Current-Mode Loser Take all Circuits for Analog Decoders. IEEE 2001, p. 748-751.

Moerz, Matthias et al. Analog Decoding of High Rate Tailbitting Codes Using the Dual Trellis. IEEE ISIT2001. 2001 p. 331.

Maundy, Brent. Min/Max Circuit for Analog Convolutional Decoders. IEEE Tranactions on Circuits and Systems—II: Analog and Digital Signal Processing, vol. 48, No. 8, 2001 p. 802-806.

Hong, Sangjin & Stark, Wayne E., Decoding Performance and Complexity Analysis for Analog and Digital Channel Decoders. IEEE 2001, p. 1277-1281.

He, Kai & Cauwenbergs, Gert. Peformance of Analog Viterbi Decoding. IEEE 1999, p. 2-5.

He, Y. & Sanchez-Sinencio. Min-Net Winner Take All CMOS Implementation. Electronics Letters, vol. 29, No. 14, 1993 p. 1237-1239.

Gunay, Z. Sezgin & Sanchez-Sinencio, Edgar. CMOS Winner Take All Circuits: A Detail Comparison. IEEE International Symposium on Circuits and Systems. Jun. 1997, p. 41-44.

Gaudet, Vincent & Galuak, P. Glenn. A 13.3 Mb/s 0.35 um CMOS Analog Turbo Decoder IC with a Configurable Interleaver. IEEE Journal of Solid State Circuits, vol. 38, No. 11. Nov. 2003, p. 2010-2015.

Gaudet, Vincent et al. Programmable Interleaver Design for Analog Iterative Decoders. IEEE Transactions on Circuits and Systems-II: Analog and Digital Signal Processing vol. 7, 2002, p. 457-464.

Gross, Warren J. et al., Difference Metric Soft-Output Detection: Architecture and Implementation. IEEE Transactions on Circuits and Systems—II: Analog and Digital Signal Processing, vol. 48, No. 10, Oct. 2001. p. 904-911.

Guadet, Vincent C. & Gulak, P. Glenn. A 13.3 Mb/s 0.35 um CMOS Analog Turbo Decoder IC With a Configurable Interleaver. IEE International Solid-State Circuits Conference. 2003, Paper 8.4.

Demosthenous, Andreas & Taylor, John. A 100-Mb/s 2.8 V CMOS Current-Mode Analog Viterbi Decoder. IEEE Journal of Solid State Circuits, vol. 37, No. 7, 2002 p. 904-910.

Demosthenous, Andreas & Taylor, John. Low Power CMOS and BiCMOS Circuits for Analog Convolutional Decoders. IEEE Transactions on Circuits and Systems—II: Analog and Digital Signal Processing, vol. 46, No. 8. 1999 pp. 1077-1080.

Carvajal, R.G., et al. High Speed Protection Voltage mode Min/Max Circuits in CMOS Technology. IEEE International Symposium on Circuits and Systems. 2000, p. 13-16.

* cited by examiner

OR

FULL CMOS MIN-SUM ANALOG ITERATIVE DECODERS

FIELD OF THE INVENTION

The invention relates to analog iterative decoders.

BACKGROUND OF THE INVENTION

In recent years, there has been much excitement in the digital communications and coding community about a class of error correcting codes which are very powerful and yet can be decoded practically using iterative algorithms. Two well-known examples are turbo codes and low-density parity-check (LDPC) codes.

See for example Berrou, C., and Glavieux A., and Thitimajshima, P. "Near Shannon limit error-correcting coding: turbo codes," in Proc. IEEE ICC'93, Geneva, Switzerland, 1993, pp. 1064-1070 and Gallager, R. G., "Low-density parity check codes," IRE Trans. Inform. Theory, vol. 8, pp. 21-28 January 1962.

The iterative algorithms can be most naturally described using graph representations of the codes. The execution of the algorithms can be described as performing certain computations at the nodes of the graph and passing real messages (soft information) along the edges, in both directions and iteratively. There are only a small number of different types of nodes in terms of their computations. In fact, this number is only two and three for LDPC codes and turbo codes, respectively.

The need for floating point computations and the iterative nature of these decoding algorithms have motivated some very recent research on the analog electronic implementation of the algorithms.

See for example S. Hemati and A. H. Banihashemi, "New Analog VLSI Circuits for Iterative Decoding," Proceedings of the 21st Biennial Symposium on Communications, Queen's University, Kingston, Ontario, Canada, pp. 261-263, Jun. 2-5, 2002; S. Hemati and A. H. Banihashemi, "Iterative Decoding in Analog CMOS," Proceedings of the 13th ACM Great Lakes Symposium on VLSI, ACM GLSVLSI 2003, Washington D.C., USA, pp. 15-20, Apr. 27-29, 2003; S. Hemati and A. H. Banihashemi, "Full CMOS Min-Sum Analog Iterative Decoder," Proceedings of the 2003 IEEE International Symposium on Information Theory, ISIT2003, Yokohama, Japan, pp. 347, Jun. 29-Jul. 4, 2003; S. Hemati and A. H. Banihashemi, "Analog Asynchronous Iterative Decoding, Different Dynamics with Better Performance," 2nd Analog Decoding Workshop Zürich, Switzerland, September 2003; S. Hemati and A. H. Banihashemi, "A Current-Mode Maximum Winner-Take-All Circuit with Low Voltage Requirement for Min-Sum Analog Iterative Decoders," Proceedings of the 10th IEEE International Conference on Electronics, Circuits and Systems, ICECS2003, Sharjah, UAE, pp 5-8, Dec. 14-17, 2003; S. Hemati and A. H. Banihashemi, "On the Dynamics of Analog Asynchronous Iterative Decoders," Proceedings of the 41st Annual Allerton Conference on Communication, Control and Computing, University of Illinois, US, pp. 1679-1687, Oct. 1-3, 2003; Hagenauer, J., Moerz, M., and Offer, E., "Analog turbo networks in VLSI: the next step in turbo decoding and equalization," in Proc. Int. Symp. on Turbo Codes and Related Topics, Brest, France, September 2000, pp. 209-218, Loeliger, H. A., Lustenberger, F., Helfenstein, M., and Tarkoy, F., "Probability propagation and decoding in analog VLSI," IEEE Trans. Inform. Theory, vol. 47, no. 2, pp. 837-843, February 2001 and Winstead, C., Dai, J., Little, S., Yong-Bin, K., and Jin Kim, W., "Analog MAP decoder for (8, 4) Hamming code in subthreshold CMOS", in Proc. Advanced Research in VLSI conference, 2001, pp. 132-147.

In analog implementations, each node in the graph acts as a computational module which communicates asynchronously with other nodes of the graph through edges. Iterations are thus eliminated and are replaced by the settling behaviour of the system. This is projected to improve the ratio of speed to power consumption by two orders of magnitude.

There are a wide variety of iterative decoding algorithms, each resulting in a different performance/complexity tradeoff. Among these, sum-product (SP), also referred to as belief propagation, performs the best but is considered to be the most complex to implement. In its original form, SP requires basic operations of addition and multiplication of real numbers, and thus the name "sum-product." While implementing adders is rather straightforward and does not require much power and area in an integrated circuit, implementing a large number of high precision digital multipliers is more challenging. In fact, this is one of the reasons for shifting from digital to analog for implementing iterative decoders. In analog circuits, the Gilbert differential multiplier is a well-known solution for implementing multiplication and is widely used in mixer and PLL circuits.

See for example Gray, P. R., and Meyer, R. G., Analysis and Design of Analog Integrated Circuits, third edition, John Wiley & Sons, 1993. In the Gilbert multiplier, bipolar transistors play a key role. In fact, most of the previously reported analog decoders for iterative schemes have been based on SP algorithm, have used the Gilbert multiplier as the core circuit, and have mostly been implemented by BiCMOS technology. BiCMOS technology has the advantage of using fast bipolar transistors together with low power and small size MOSFETs. However, the BiCMOS technology has a complex fabrication process compared to standard CMOS and this translates into higher cost.

There have also been some attempts to implement the SP algorithm with MOSFETs in weak inversion mode (subthreshold region) where transistors are partially turned on, and behave like slow bipolar transistors. See for example Winstead, C., Dai, J., Little, S., Yong-Bin, K., and Jin Kim, W., "Analog MAP decoder for (8, 4) Hamming code in sub-threshold CMOS," in Proc. Advanced Research in VLSI conference, 2001, pp. 132-147 and Johns, D. A. and Martin, K., Analog Integrated Circuit Design, first edition, John Wiley & Sons, 1997. Sub-threshold circuits in general have the advantage of consuming a very small amount of power, but often suffer from low speed, mismatch problems and low accuracy.

Another iterative decoding algorithm is referred to as "min-sum" (MS), described in, for example, Forney, Jr, G. D. "On iterative decoding and two-way algorithm", in Proc. Int. Symp. on Turbo Codes and Related Topics, Brest, France, September 1997, pp. 12-25, which can be regarded as an approximation of SP. Other common names for min-sum algorithm are "max-sum", "max-product", "max-log MAP" and "BP-based decoding". For many codes, the performance of MS is slightly (a few tenths of a dB) worse than that of SP. However, it has lower complexity, and unlike SP, does not require an estimate of noise power. More recently, it has also been shown that MS is more robust against quantization noise than SP. See Zarkeshvari, F., and Banihashemi, A. H. "On implementation of min-sum algorithm for decoding low-density parity-check (LDPC) codes," in Proc. Globecom 2002, Taipei, Taiwan, Nov. 17-21, 2002.

In fact, MS can be implemented digitally by using only 4 bits compared to 6 bits for a similar implementation of SP. Moreover, there are simple modifications of min-sum that can perform very close to sum-product algorithm. These modifications were presented in Zarkeshvari, F., and Banihashemi, A. H. "On implementation of min-sum algorithm for decoding low-density parity-check (LDPC) codes," in Proc. Globecom 2002, Taipei, Taiwan, Nov. 17-21, 2002; J. Zhao, "Effects of clipping and quantization on min-sum algorithm and its modifications for decoding low-density parity-check codes," M. Sc. dissertation, Dept. of Systems and Computer Engineering, Carleton University, Ottawa, Canada, 2003; J. Chen and M. Fossorier, "Near optimum universal belief propagation based decoding of low-density parity-check codes," IEEE Tran. Comm., vol. 50, pp. 406-414, March 2002; J. Chen, A. Dholakia, E. Eleftheriou, M. Fossorier and X.-Y. Hu, "Near optimal reduced complexity decoding algorithms for LDPC codes," Proc. IEEE ISIT, Lausanne, Switzerland, p. 455, Jun. 30-Jul. 5, 2002; J. Chen and M. Fossorier, "Density evolution for two improved BP-based decoding algorithms of LDPC codes," IEEE Comm. Lett., vol. 6, no. 5, pp. 208-210, May 2002; J. Chen and M. Fossorier, "Density evolution for BP-based decoding algorithms of LDPC codes and their quantized versions," Proc. IEEE Globecom, pp. 1378-1382, November 2002. These modifications involve reducing the absolute value of the outgoing messages in parity-check nodes and performing clipping.

Because of imperfections in the fabrication process, the problem of mismatch in large analog integrated circuits becomes very important and the higher robustness in min-sum can also greatly help in mitigating this problem.

SUMMARY OF THE INVENTION

Min-sum analog iterative decoders for LDPC codes based on new max WTA circuits are provided. Current-mode full CMOS circuits are provided for implementing the min-sum decoder. The circuits can be fabricated by standard CMOS technology. This means lower fabrication cost and simpler design compared to the previously reported analog iterative decoders. An architecture for min-sum decoder is presented. Min WTA voltage mode circuits may be used as well.

Modules with large number of inputs can be fabricated easily and with less delay compared to previously reported analog iterative decoders. The modules can also be used as building blocks for implementing the decoders for other iterative coding schemes than LDPC codes. These include turbo, convolutional and block codes.

A new current-mode maximum winner-take-all (Max WTA) circuit is provided. In some embodiments, the inputs and the output of the circuit are high swing, and the voltage requirements for the inputs and the output are very low and just about $V_{eff(Vsat)}$ and $2V_{eff}(2V_{sat})$, respectively. Because of the cascode configuration, the proposed circuits show very good precision even for short channel MOSFETs.

Advantageously, the new circuits can be implemented with standard CMOS technology and use conventional biasing methods. This makes them more practical and affordable.

According to one broad aspect, the invention provides an analog min-sum iterative decoder comprising: a plurality of standard CMOS variable nodes and a plurality of standard CMOS check nodes, the variable nodes and the check nodes being interconnected with a plurality of interconnections in accordance with a code to be decoded; wherein real-valued messages are passed on each interconnection between one of said variable nodes and one of said check nodes.

In some embodiments, each interconnection between one variable node and one check node comprises a first line from the variable node to the check node conveying a first real valued message, and a second line from the check node to the variable node conveying a second real valued message.

In some embodiments, each interconnection between one variable node and one check node comprises a first pair of lines from the variable node to the check node conveying a first differential real valued message, and a second pair of lines from the check node to the variable node conveying a second differential real valued message.

In some embodiments, each check node and each variable node has an output impedance substantially greater than an Rds of a single transistor in an output stage of the check node or variable node.

In some embodiments, each check node and each variable node has a high swing output stage.

In some embodiments, each check node and each variable node has an output stage allowing a swing at least between $2V_{eff}$ and $V_{dd}$, where $V_{eff}$ is an effective gate voltage and $V_{dd}$ is a power supply voltage.

In some embodiments, a decoder further comprises shielding and/or guard rings around any digital circuits and digital interconnections within check nodes or variable nodes to reduce effects of switching noise.

In some embodiments, each standard CMOS check node comprises: a respective real to absolute and sign function for each input to the check node, the real to absolute and sign function producing a respective absolute value output and a respective sign output; for each input to the check node: a respective minimum WTA function connected to receive absolute value outputs of the real to absolute and sign functions other than the absolute value output respective the input, adapted to produce a minimum WTA output which is a minimum of the absolute value inputs; a respective XOR function connected to receive sign outputs of the real to absolute and sign functions other than the sign output respective the input, adapted to produce a sign output; an absolute and sign to real converter connected to receive the minimum WTA output and the sign output, adapted to produce a real valued output.

In some embodiments, each analog standard CMOS check node comprises: a respective real to absolute and sign function for each input to the check node, the real to absolute and sign function producing a respective absolute value output and a respective sign output; a minimum WTA function connected to receive absolute value outputs of all of the real to absolute and sign functions, adapted to produce a minimum WTA output which is a minimum of the absolute value inputs; a second minimum WTA function connected to receive absolute value outputs of all of the real to absolute and sign functions, adapted to produce a second minimum WTA output which is a second minimum of the absolute value inputs; switching circuitry adapted to select either the minimum WTA output or the second minimum WTA output as a respective min WTA output for each input; for each input: a respective XOR function connected to receive sign outputs of the real to absolute and sign functions other than the sign output respective the input, adapted to produce a sign output; an absolute and sign to real converter connected to receive the respective minimum WTA output and the sign output, adapted to produce a real valued output.

In some embodiments, each real to absolute and sign function for each input to the check node comprises: a PMOS current mirror and an NMOS current mirror each connected to receive the input; a high swing cascode current mirror having an output connected to a diode connected circuit; wherein an output of the NMOS current mirror is connected to an input of the high swing cascode current mirror, and an output of the NMOS current mirror is connected to the output of the high swing cascode current mirror; a sign conversion circuit connected to receive the input and produce a sign output.

In some embodiments, each minimum WTA function comprises: a maximum WTA function comprising: a common high swing output stage; a plurality of input stages each having a respective feedback path, the feedback paths competing to establish a shared voltage so as to produce a winning current in the common high swing output stage substantially equal to the maximum input current.

In some embodiments, the minimum WTA function has an output resistance at least on the order of $Rds^2$.

In some embodiments, the shared output stage has a cascode structure.

In some embodiments, a decoder further comprises: a plurality of reference current sources for realizing the minimum WTA function from the maximum WTA function.

In some embodiments, in each max WTA circuit: for each input stage: a) the input stage comprises a cascode structure with an input current being input at a first end of the cascode structure, and with the shared voltage being connected to a gate of a transistor at a second end of the cascode structure; b) the respective feedback path comprises a connection from the top of the cascode structure through a feedback transistor to a point at which said shared voltage is established; the common high swing output stage comprises a cascode structure substantially similar to the cascode structure of the input stages, wherein an output current is produced at a first end of the cascode structure as a result of the shared voltage being connected to a gate of a transistor at a second end of the cascode structure.

In some embodiments, the output stage comprises a bleeding transistor to which said shared voltage is applied.

In some embodiments, in each max WTA circuit: each input stage comprises a cascode structure with an input current being input between a first transistor and a second transistor of the cascode structure, and with the shared voltage being connected to gates of the first and second transistors; the output stage comprises a cascode structure having an output between a first transistor and a second transistor of the cascode structure at which a feedback current is produced, with the shared voltage being connected to gates of the first and second transistors; each input stage has a respective feedback path comprising a connection from the top of the cascode structure through a gate of a feedback transistor, the feedback transistor being connected to the input of the output stage; wherein the input stages compete to establish the shared voltage which is applied to the output stage to produce the feedback current substantially equal to the maximum input current, and the feedback current is applied through the feedback transistor(s) of the winning input stage(s) to produce an output current.

In some embodiments, each absolute and sign to real converter receives an absolute input and a sign input, and the absolute and sign to real converter comprises: an NMOS current mirror having two output stages, the NMOS being connected to receive the absolute input, and a PMOS current mirror having an input stage and an output stage, the PMOS current mirror being connected above the two output stages of the NMOS current mirror; a first switch between the two output stages of the NMOS current mirror; a second switch between the input and output stages of the PMOS current mirror; wherein the first and second switches have opposite states controlled by the sign input such that either the output stage of the NMOS current mirror is active, or the second output stage of the PMOS current mirror is active.

In some embodiments, each variable node has at least one check node input each from a respective check node and a has decoder input, and each variable node has a corresponding check node output for each check node input and has a decoder output, the variable node comprising: for each input, a respective input current buffer converting a sign of the input to produce a negative input, each input current buffer having a respective first input current buffer output stage; a sum current buffer connected to receive a sum of negative inputs produced by the input current buffers to produce a sum current equal to a sum of the inputs, the sum current buffer having a first sum current buffer output stage; a sign detecting circuit connected to determine the sign of the sum current, the sign of the output being the decoder output; for each check node output: a respective sum current buffer output stage of which said first sum current buffer output stage may be one, adapted to produce/reproduce the sum current output; a second input current buffer output stage connected to the respective input current input stage and adapted to produce a replica of the negative input current; a respective real valued output for the check node output being produced by adding the sum current output to the replica of the negative input current.

In some embodiments, each input current buffer comprises a PMOS current mirror and an NMOS current mirror connected to receive the input and to generate the negative input.

In some embodiments, the sum current buffer comprises a PMOS current mirror and an NMOS current mirror connected to receive the sum of the negative input currents and to produce sum current output.

In some embodiments, a decoder each sign detecting circuit comprises a pair of NOT circuits connected consecutively.

According to another broad aspect, the invention provides a circuit for implementing a plurality of minimum WTA functions, the circuit comprising: a minimum WTA function connected to receive absolute value inputs, adapted to produce a minimum WTA output which is a minimum of the absolute value inputs; a second minimum WTA function connected to receive the absolute value inputs, adapted to produce a second minimum WTA output which is a second minimum of the absolute value inputs; and switching circuitry adapted to select either the minimum WTA output or the second minimum WTA output as a respective min WTA output for each input.

According to another broad aspect, the invention provides a maximum WTA circuit comprising: a common high swing output stage; a plurality of input stages each having a respective feedback path, the feedback paths competing to establish a shared voltage so as to produce a winning current in the common high swing output stage substantially equal to the maximum input current.

In some embodiments, a maximum WTA circuit has an output resistance at least on the order of $Rds^2$.

In some embodiments, the shared output stage has a cascode structure.

In some embodiments, a minimum WTA circuit comprises: a maximum WTA circuit; a plurality of reference current sources for realizing the minimum WTA function from the maximum WTA function.

In some embodiments, for each input stage: a) the input stage comprises a cascode structure with an input current being input at a first end of the cascode structure, and with the shared voltage being connected to a gate of a transistor at a second end of the cascode structure; b) the respective feedback path comprises a connection from the top of the cascode structure through a feedback transistor to a point at which said shared voltage is established; the common high swing output stage comprises a cascode structure substantially similar to the cascode structure of the input stages, wherein an output current is produced at a first end of the cascode structure as a result of the shared voltage being connected to a gate of a transistor at a second end of the cascode structure.

In some embodiments, the output stage comprises a bleeding transistor to which said shared voltage is applied.

In some embodiments, each input stage comprises a cascode structure with an input current being input between a first transistor and a second transistor of the cascode structure, and with the shared voltage being connected to gates of the first and second transistors; the output stage comprises a cascode structure having an output between a first transistor and a second transistor of the cascode structure at which a feedback current is produced, with the shared voltage being connected to gates of the first and second transistors; each input stage has a respective feedback path comprising a connection from the top of the cascode structure through a feedback transistor to the input of the output stage; wherein the input stages compete to establish the shared voltage which is applied to the output stage to produce the feedback current substantially equal to the maximum input current, and the feedback current is applied through the feedback transistor(s) of the winning input stage(s) to produce an output current.

According to another broad aspect, the invention provides a second maximum WTA circuit comprising: a common high swing output stage; a plurality of input stages; for each combination of two input stages, a feedback path containing a two transistors, each of the two transistors being controlled by a respective one of the two input stages, the feedback paths competing to establish a shared voltage so as to produce a winning current in the common high swing output stage substantially equal to the second maximum input current.

In some embodiments, different feedback paths share transistors.

In some embodiments, a second maximum WTA circuit has an output resistance at least on the order of $Rds^2$.

In some embodiments, the shared output stage has a cascode structure.

In some embodiments, for each input stage, the input stage comprises a cascode structure with an input current being input at a first end of the cascode structure, and with the shared voltage being connected to a gate of a transistor at a second end of the cascode structure; for each pair of input stages, the respective feedback path is connected to the shared voltage, the respective feedback path comprising a series connection of two transistors, one of the two transistors having a gate voltage connection to the top of a first of the pair of input stages, the other of the two transistors having a gate voltage connection to the top of a second of the pair of input stages; the common high swing output stage comprises a cascode structure substantially similar to the cascode structure of the input stages, wherein an output current is produced at a first end of the cascode structure as a result of the shared voltage being connected to a gate of a transistor at a second end of the cascode structure.

In some embodiments, the output stage comprises a bleeding transistor to which said shared voltage is applied.

In some embodiments, each input stage comprises a cascode structure with an input current being input between a first transistor and a second transistor of the cascode structure, and with the shared voltage being connected to gates of the first and second transistors; the output stage comprises a cascode structure having an output between a first transistor and a second transistor of the cascode structure at which a feedback current is produced, with the shared voltage being connected to gates of the first and second transistors; each combination of two input stages has a respective feedback path comprising a series connection of two transistors, one controlled by a voltage at the top of the one of the two input stages, and the other controlled by a voltage at the top of the other of the two input stages; wherein the input stages compete to establish the shared voltage which is applied to the output stage to produce the feedback current substantially equal to the second maximum input current, and the feedback current is applied through the feedback transistor(s) of the winning input stage(s) to produce an output current.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Min-Sum Decoding Algorithm

To explain the min-sum algorithm, binary LDPC codes will be considered together with the bipartite graph that represents the code through its parity-check equations, referred to as a "Tanner graph". See for example Tanner, R. M., "A recursive approach to low-complexity codes," IEEE Trans. Inform. Theory, vol. 27, pp. 533-547, September 1981.

There are two sets of nodes in a Tanner graph: 1) variable nodes representing code bits, and 2) check nodes representing parity-check equations. To implement the min-sum algorithm in such a graph, two types of computational modules are required: one for variable nodes (VAR) and the other for check nodes (CHK). The operations performed in VAR and CHK modules depend on the representation of soft information (messages that are passed among CHK and VAR nodes through edges).

Figure 1:
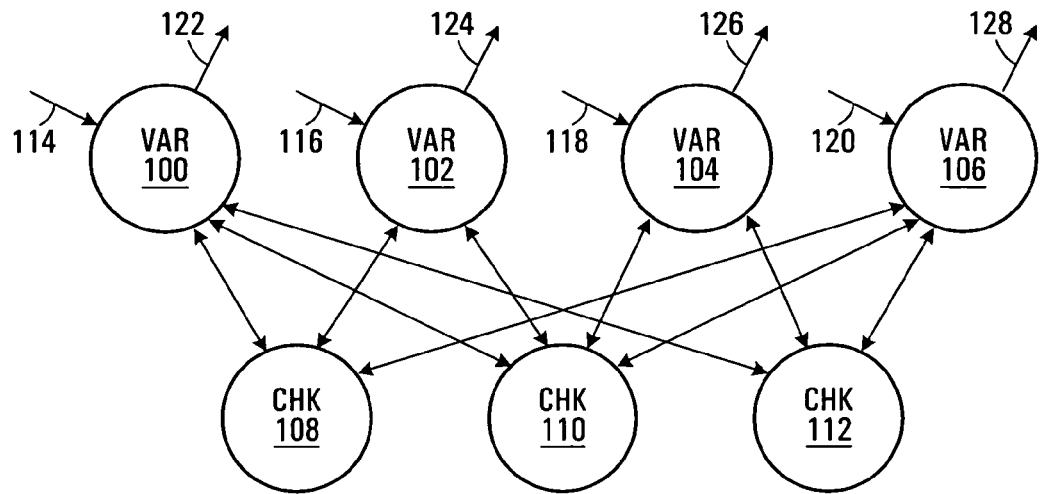
FIG. 1 is an example of a Tanner graph for an LDPC code.

Referring first to FIG. 1, shown is an example of a Tanner graph. This Tanner graph has four VAR nodes 100,102,104, 106 and three CHK nodes 108,110,112. Each VAR node 100,102,104,106 has a respective input 114,116,118,120 which is typically soft information recovered from the channel. Each VAR node 100,102,104,106 also has an output 122,124,126,128. These outputs generate the decoded codeword. The interconnections between the VAR nodes and the CHK nodes are defined entirely by the structure of a given code. The interconnections are bi-directional meaning that for each interconnection, a message is passed from the VAR node to the CHK node and from the CHK node to the VAR node. In physical implementations, there are separate interconnections leading from the VAR node to the CHK node and leading from the CHK node to the VAR node. Each interconnection is also referred to as an "edge". The Tanner graph of FIG. 1 is a specific example provided for the purpose of illustration. It is to be understood that a given code will have its own Tanner graph. It is noted that conventional Tanner graphs do not show the inputs such as inputs 114,116,118,120 or the outputs such as outputs 122,124,126,128. However, the codes would still need to generate these outputs and receive these inputs. A message along an edge e, which connects a variable node v to a check node c, in general reflects the conditional probabilities of v being zero ($p_0$) or one ($p_1$), with $p_0+p_1=1$. In the description which follows, the log-likelihood ratio (LLR) is used as the message, i.e., $$M = \ln\left(\frac{p_0}{p_1}\right) \quad (1)$$

The operations in the VAR and CHK modules will then be $$VAR: M_{v \to c} = \sum_{i \in N(c) \backslash c} M_{i \to v} + M_v^{(o)} \quad (2)$$

$$CHK: M_{c \to v} = \prod_{i \in N(c) \backslash v} \text{sgn}(M_{i \to c}) \cdot \min_{i \in N(c) \backslash v} |M_{i \to c}| \quad (3)$$

where $M_v^{(0)}$ is the initial local message at variable node v (i.e. the initial input), N(.) represents the set of neighbouring nodes, and sgn(.) returns 1 or −1 depending on its argument being non-negative or negative, respectively. Equivalently in the circuits, sign is shown by 0 or Vdd voltages and multiplication of the signs is replaced by an XOR function. The initial message $M_v^{(0)}$ is computed by replacing the conditional probability density functions of the channel output y corresponding to v in (1). It can be shown that for the binary input AWGN channel, $M_v^{(0)}$ can in fact be simplified to the received value y.

In its synchronous form, the algorithm starts by all the variable nodes passing $M_v^{(0)}$ to their neighbouring check nodes. Then iterations start. Each iteration consists of all the check nodes passing messages to variable nodes according to (3), and subsequently all variable nodes sending messages to check nodes based on (2). At each iteration, the hard decision assignment for each bit v is decided based on $$M = \sum_{i \in N(v)} M_{i \to v} + M_v^{(0)} \quad (4)$$

and by $$\hat{v} = \frac{1 - \text{sgn}(M)}{2} \quad (5)$$

The algorithm then stops if the assignment is a codeword, or a maximum number of iterations is reached.

Figure 2:
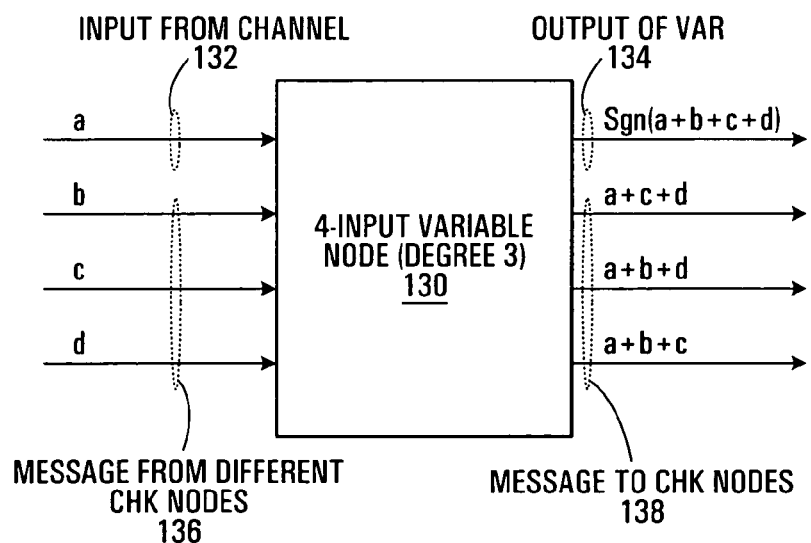
FIG. 2 is a block diagram of a 4-input variable node.

Referring now to FIG. 2, a block diagram of a variable node of degree 3 is shown generally indicated at 130. A variable node of degree n has n+1 inputs and n+1 outputs. One input 132 corresponds to the soft information from the channel and one output 134 goes to the output of the decoder. In this block diagram, "a" is the channel input 132 and sgn(a+b+c+d) is the decoder output 134. Other inputs ("b", "c" and "d") 136 are coming from different CHK modules and their corresponding VAR outputs 138 go to the specified CHK modules (for example, "a+c+d" goes to the CHK module that generated "b"). As it is clear in this block diagram, the basic operations in a variable node are addition and getting the sign of a signal. Each output 138 going to a CHK node is simply a sum of all of the inputs to the VAR node except the corresponding input to the particular output. For example, the output corresponding to input "b" consists of the sum of a+c+d, but not b.

Figure 3:
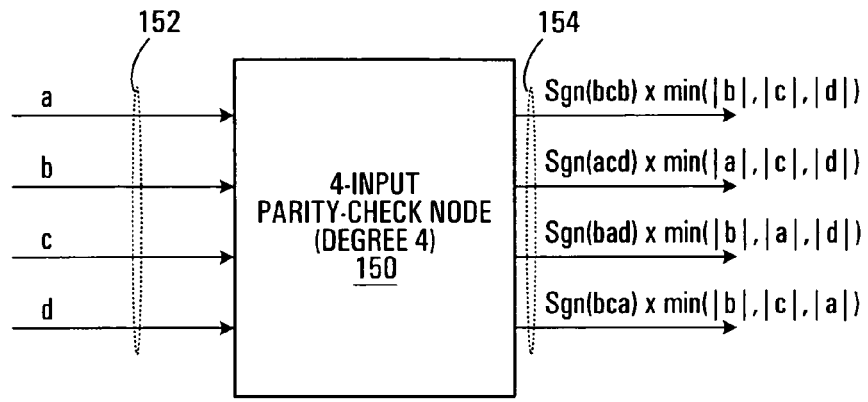
FIG. 3 is a block diagram of a 4-input parity-check node.

Referring now to FIG. 3 the basic operations inside a CHK module 150 of degree 4 are shown. Four inputs "a", "b", "c" and "d" 152 are used to just show the soft information represented by currents and could have positive or negative signs. They are not related to the terminology used for inputs of VAR module. Each input 152 is received from one of the outputs 138 of a VAR node. The CHK module 150 also generates four outputs 154, each input 152 has a corresponding output 154. The corresponding output for a given input has a sign equal to the sign of the product of the remaining inputs other than the corresponding input, and has an amplitude equal to the minimum of the absolute value of the inputs other than the corresponding input.

One function executed by the CHK modules is a min winner take all (Min WTA) function which can be implemented in a Min WTA circuit by making small changes to a max WTA circuit. In a practical min-sum iterative decoder, a large number of Max WTA circuits are implemented. As an example, for implementing a min-sum iterative decoder for a (1008, 504) regular LDPC code, more than 3000 Max WTA circuits should be implemented and each Max WTA should have 5 inputs. For LDPC codes the number of inputs in Max WTA circuits is usually small.

Beyond such decoding applications, Max WTA circuits have a wide range of applications in analog signal processing such as fuzzy logic controllers, artificial neural networks, and analog rank extractors, to name a few. There are many designs available for Max WTA circuits. See for example J. Lazzaro, S. Lyckenbush, M. A. Malhowad, and C. Mead, "Winner-take-all of O(n) complexity", in Advances in Neural Signal Processing Systems, pp. 703-711, 1989, I. E. Opris, "Analog rank extractors," IEEE Trans. Circuits Syst. I, vol. 44, no. 12, pp. 1114-140, January 1998, I. E. Opris, "Rail-to-rail multiple-input Min/Max circuit," IEEE Trans. Circuits Syst. II, vol. 45, no. 1, pp. 137-140, January 1998, I. E. Opris, Analog rank extractors and sorting networks, Ph.D. dissertation, Stanford Univ., Stanford, Calif., 1996, I. Baturone, J. L. Huertas, A. Barriga and E. Sanchez-Solano, "Current-mode multiple-input Max circuit," Electronic. Lett., vol. 30, no. 9, pp. 678-679, April 1994, R. G. Carvajal, J. Ramirez-Angulo and J. Tombs, "High-speed high precision voltage-mode Min/

Max circuits in CMOS technology," in Proc. IEEE Int. Symp. Circuits and Systems, Geneva, Switzerland, pp. 13-16, May, 2000, Z. S. Gunay and E. Sanchez-Sinenico "CMOS winner-take-all circuits: A detail comparison," in Proc. IEEE Int. Symp. Circuits and Systems, pp. 41-44, June, 1997, Y. He, and E. Sanchez-Sinencio, "Min-net Winner-take-all CMOS implementation," Electronic. Lett., vol. 29, no. 14, pp. 1237-1239, July 1993 and B. Maundy, "Min/Max circuit for analog conventional decoders," IEEE Trans. Circuits Syst. II, vol. 48, no. 8, pp. 802-806, August 2001. For most existing circuits, due to the short channel effect, the accuracy degrades drastically when fabricated by more advanced CMOS technologies.

However, new CMOS fabrication technologies with shorter channel lengths and increasing output conductance, as well as the persistent trend towards reduced supply voltages have made analog design more challenging. It is therefore of great interest to devise topologies with large input/output voltage swing, small voltage requirements and improved accuracy. Moreover, the existing circuits are not high swing, and the minimum allowable voltage at the inputs and the output is larger than $V_T+V_{eff}$, where $V_T$ is the MOSFET threshold voltage and $V_{eff}$ is the effective voltage defined as $V_{gs}-V_T$. In I. Baturone, J. L. Huertas, A. Barriga and E. Sanchez-Solano, "Current-mode multiple-input Max circuit," Electronic. Lett., vol. 30, no. 9, pp. 678-679, April 1994, good accuracy is achieved by using a MOSFET-based cascode configuration, but the voltage requirement at the inputs and the output is still quite high and is equal to $2V_T+2V_{eff}$ and $V_T+2V_{eff}$, respectively. Some building blocks of an analog iterative decoder using standard CMOS technology, and based on the min-sum algorithm are taught in Applicant's publication "New Analog VLSI Circuits for Iterative Decoding" which was presented in June 2002 at the 21st Biennial symposium on Communications, Queen's University, Kingston, ON, Canada hereinafter the "2002 paper". A complete implementation of an analog decoder was not presented, and the designs that were presented suffer from some disadvantages enumerated below.

A first embodiment of the invention provides an analog iterative decoder implemented entirely in standard CMOS technology. The analog iterative decoder is comprised of VAR nodes, and CHK nodes which are interconnected in accordance with the Tanner graph of a given code. An example of a Tanner graph is shown in FIG. 1. Each given code will have its own Tanner graph. In preferred embodiments of the invention, each interconnection between a CHK node and a VAR node is implemented using two conductive paths, one for a message from the CHK node to the VAR node, and the other for a message from the VAR node to the CHK node. Using only two paths requires that the messages be real values which convey both sign and amplitude information.

Figure 4:
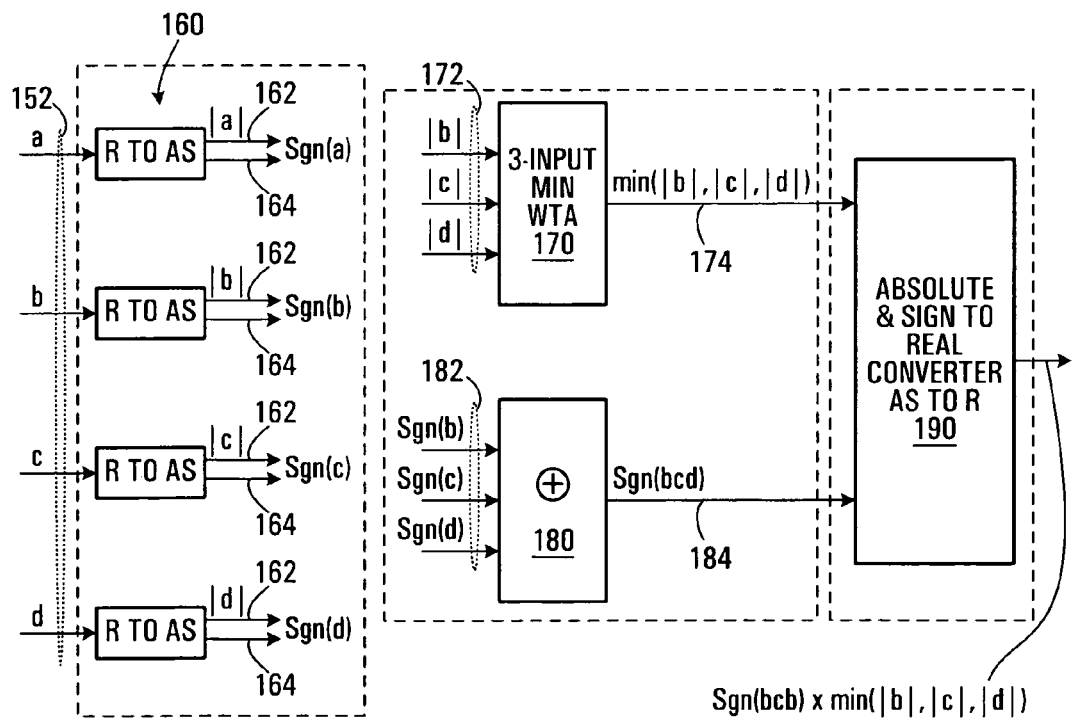
FIG. 4 is a detailed block diagram of a parity-check node provided by an embodiment of the invention.

Referring now to FIG. 4, the CHK node is implemented using four building blocks. The particular building blocks shown are those that would be implemented for a four input CHK node. However, it is to be understood that these building blocks would scale accordingly for CHK nodes having different numbers of inputs. The first building block 160 performs real to absolute value and sign (R to AS) functions, and takes four inputs 152 and produces eight outputs. Four of these outputs 162 are the absolute values of the four inputs 152, and four of the outputs 164 are the signs of the four inputs 152. The second building block 170 consists of a minimum winner take all function, in this case a 3-input minimum winner take all function (Min WTA). A 3-input Min WTA function takes three absolute value inputs 172 and produces an output 174 that is equal to the minimum of the three absolute value inputs. To implement the CHK node function, a respective Min WTA function 170 is required for each output. Thus, for a 4-input parity CHK node, there is a requirement for four 3-input Min WTA functions. Only one of these is shown in FIG. 4 in the interest of simplifying the diagram. However, there would be four of these with appropriate interconnections to the outputs of the real to absolute and sign converter functions 160. A third building block 180 is a 3-input XOR function. This takes the sign of three inputs and outputs the sign of the product of the three inputs. Again, a respective XOR function would be required for each output of the CHK node. The sign inputs indicated at 182 are received from appropriate outputs of 164 of the real to absolute and sign converters 160. The sign of the product is indicated at 184. The final building block 190 is an absolute and sign to real converter. This takes the minimum absolute value 174 from a 3-input Min WTA function, the sign 184 output by the 3-input XOR function 180, and produces an output that has the absolute value 174 and has a sign equal to sign 184. A respective absolute and sign to real converter would again be required for each output of the CHK node.

Various example standard CMOS implementations of each of the building blocks of the analog iterative decoder will now be provided in accordance with embodiments of the invention. These will include the VAR node, and the CHK node, the CHK node having in turn the building blocks consisting of the real to absolute and sign converters, minimum winner take all circuits, and absolute and sign to real converters. It is noted that many standard CMOS implementations for XOR functions are available and as such these will not be presented here. Most processing is performed in analog domain so the effect of switching noise in XOR digital circuits should be minimized. This can be done by using low noise digital circuits (for instance, DCVSL logic family). Also, preferably suitable guard rings are used around digital gates to provide some shielding to analog circuits against switching noise in digital circuits.

Preferably, digital signals are made available locally only in new designs and can be shielded. It is noted that in the paper 2002 it was not possible to shield as sign bits are sent from variable nodes to parity-check and vice versa and are globally available.

VAR Node Implementations

Figure 5:
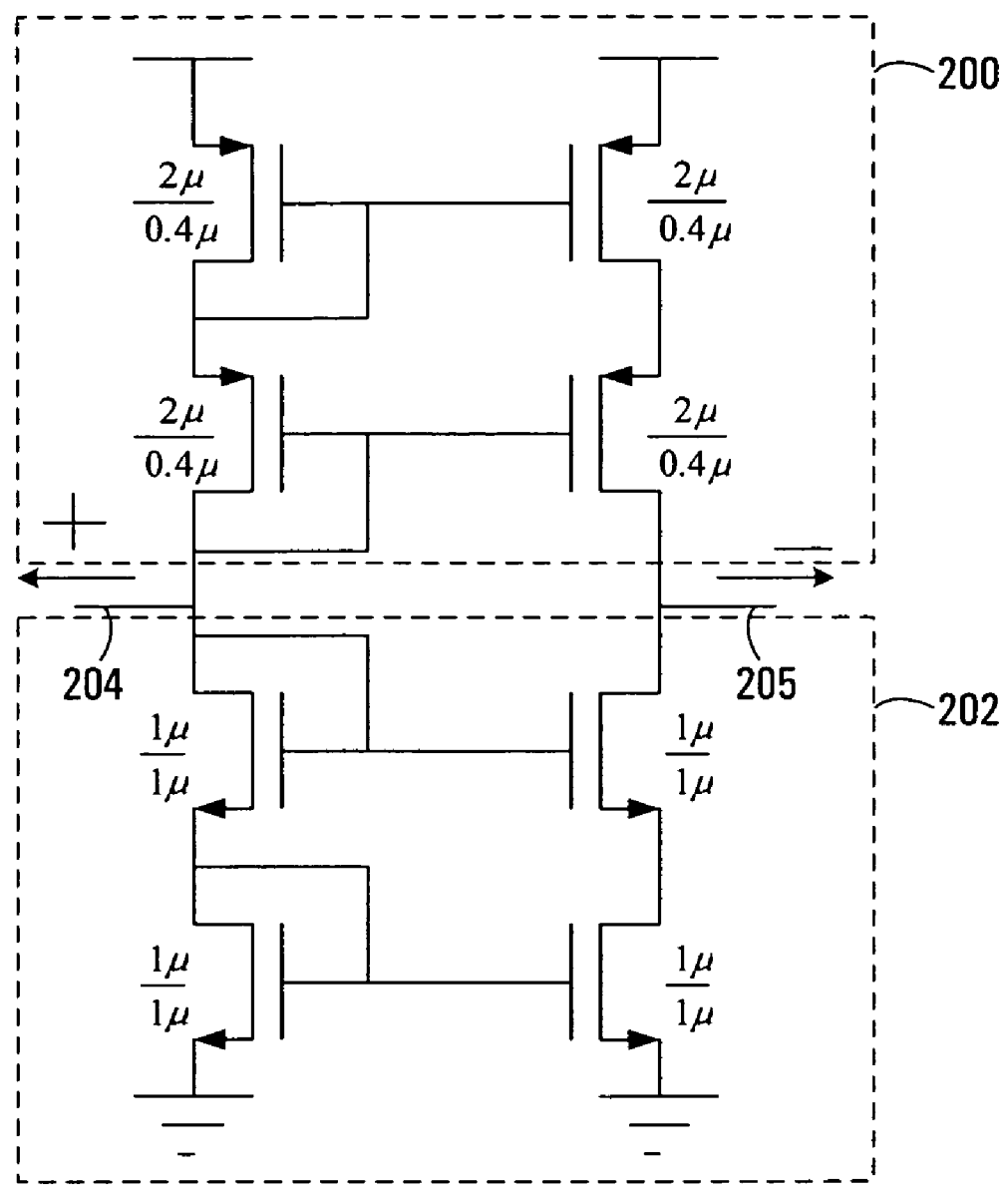
FIG. 5 is a circuit diagram of a current buffer function.

To begin, FIG. 5 is a current buffer circuit that can be used in the VAR modules described below. This circuit transfers the input current to its output but in an opposite direction. The difference between this circuit and a current mirror is in the ability of this circuit to be functional regardless of the direction of the input current that could either leave the circuit or enter the circuit. In fact, the direction of the current shows the sign of the current and consequently the sign of the soft information being considered. This circuit basically consists of two otherwise conventional cascode current mirror circuits 200,202. Circuit 200 is a PMOS cascode current mirror and circuit 202 is an NMOS cascode current mirror. The functionality of this circuit can be explained as follows. Depending on the direction of the input current 204, either the top current mirror 200 or the bottom current mirror 202 will be active. In this figure, as the sign of input current 204 is positive and current leaves the circuit at output 205, just the current mirror 200 on top is active. The output current will leave the circuit in the opposite direction and with the same size as the input current. Similarly, if the input current was negative (coming into the circuit) the bottom current mirror 202 would be active and the output current would be coming into the circuit at output 205.

Figure 6:
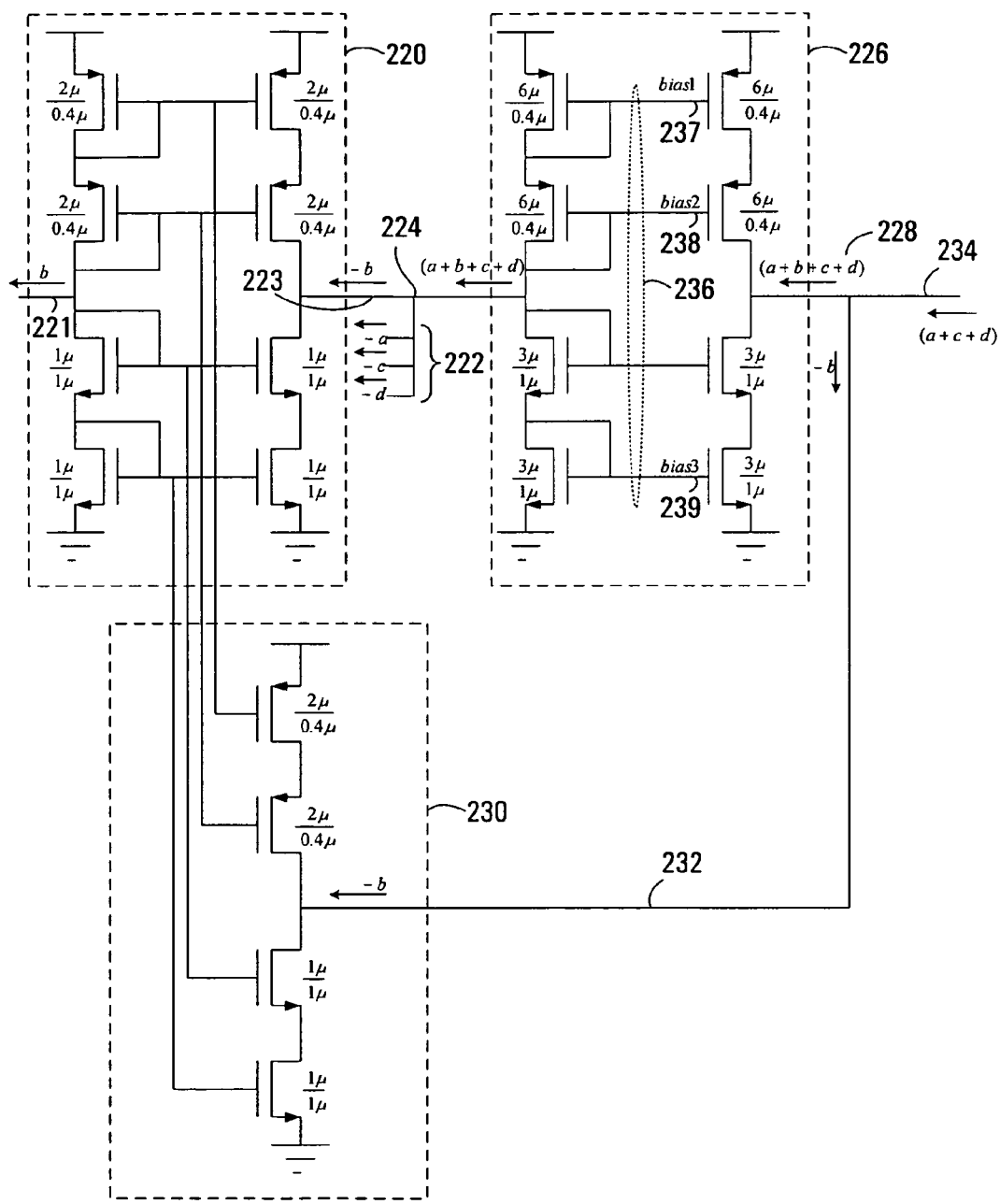
FIGS. 6 and 7 are circuit diagrams collectively implementing a variable node function in accordance with an embodiment of the invention.

Referring now to FIG. 6 shown is an example implementation of a three input VAR module that can be scaled to an arbitrary number of inputs. Inputs ("a", "b", "c" and "d") are connected to respective current-buffers (described above with reference to FIG. 5) to generate the same currents with the flipped signs. Only the buffer 220 for input "b" 221 is shown to simplify the drawings. The output of buffer 220 is "−b" 223. The outputs "−a", "−c", "−d" are indicated at 222 and are generated by respective current buffers. The outputs 222,223 of the current-buffers are tied together at 224 to generate "−(a+b+c+d)." Another current-buffer 226 converts this current to "a+b+c+d" at 228.

One of the required outputs of the VAR node is "a+c+d". This can be obtained by subtracting b from the output 228 of buffer 226. "−b" is generated by reproducing the output stage of the current-buffer 220 that was used to generate −b. This output stage is shown at 230.

Then "−b" 232 output by output stage 230 is combined with "a+b+c+d" output at 228 by buffer 226 to generate "a+c+d" at 234.

The "a+c+d" can be obtained as described above. The three other outputs for the VAR module also need to be generated. This can be done by using the circuits shown in FIG. 7. By adding "−c" and "−d" to "a+b+c+d", "a+b+d" and "a+b+c" can be generated respectively. To do this, the output stage of the current-buffer 226 of FIG. 6 is reproduced for each of the required outputs, as indicated at 240 for output "a+b+d" and 242 for output "a+b+c." The bias voltages 236 in buffer 226 are also applied to output stages 240,242 so that these output stages again generate "a+b+c+d." These voltages include bias1 237, bias2 238, bias3 239. The output stages of the current-buffers (not shown) that are used to produce "−c" and "−d" are reproduced. These circuits are not shown, but the currents 244 for "−c" and 246 for "−d" are shown. When "−c" 244 is combined with "a+b+c+d" output by output stage 240, "a+b+d" is output 250. Similarly, when "−d" 246 is combined with "a+b+c+d" output by output stage 242, "a+b+c" is generated 252.

Figure 7:
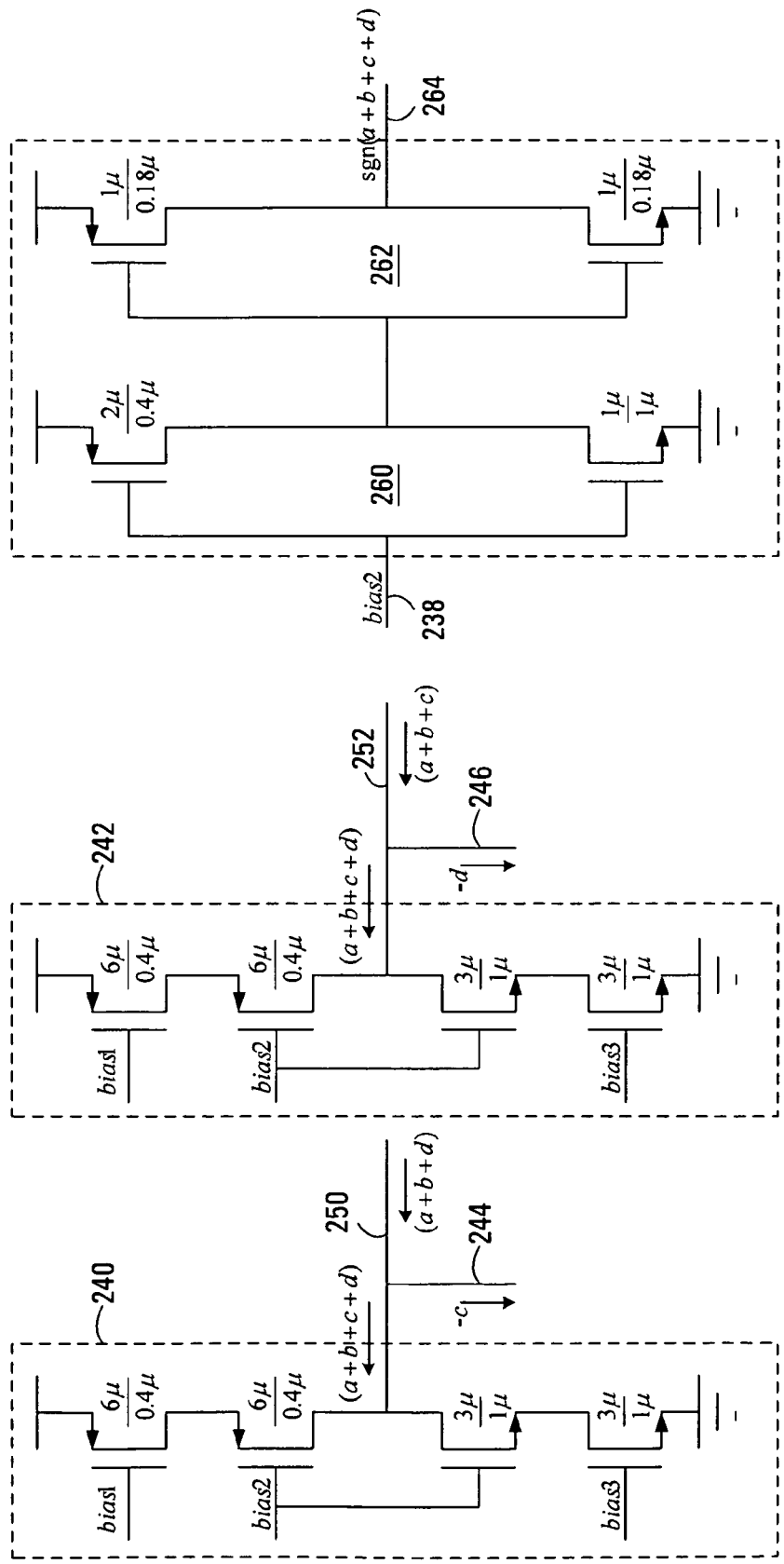

Also based on the bias2 voltage 238, which is a function of amplitude and sign of "a+b+c+d", the sign of (a+b+c+d) can be determined. In order to do that, two not circuits 260,262 are cascaded as shown in FIG. 7. By comparing the bias2 238 and the threshold voltage of the not circuits 260,262 the output sign is generated at 264. For instance if bias2 is smaller than the threshold of the not circuits 260,262, the output 264 would be zero and if bias2 is greater than the threshold the output 264 would be $V_{dd}$. Thus, the circuits of FIGS. 6 and 7 can be used to generate all of the VAR outputs.

A specific VAR circuit has been presented, but the invention is not limited to this specific implementation. For example, transistor sizes could be changed. Different current-mirrors could be used in current-buffer. Instead of using current in a wire to represent soft information, it is possible to represent information by a difference of two currents and it would be even advantageous as it is robust against common mode noise but has a drawback that twice as many interconnections are needed.

CHK Node Implementations

Recall the CHK node requires real to absolute and sign (R to As) circuits, Min WTA circuits and absolute and sign to real converters.

R to AS Circuit

Figure 8:
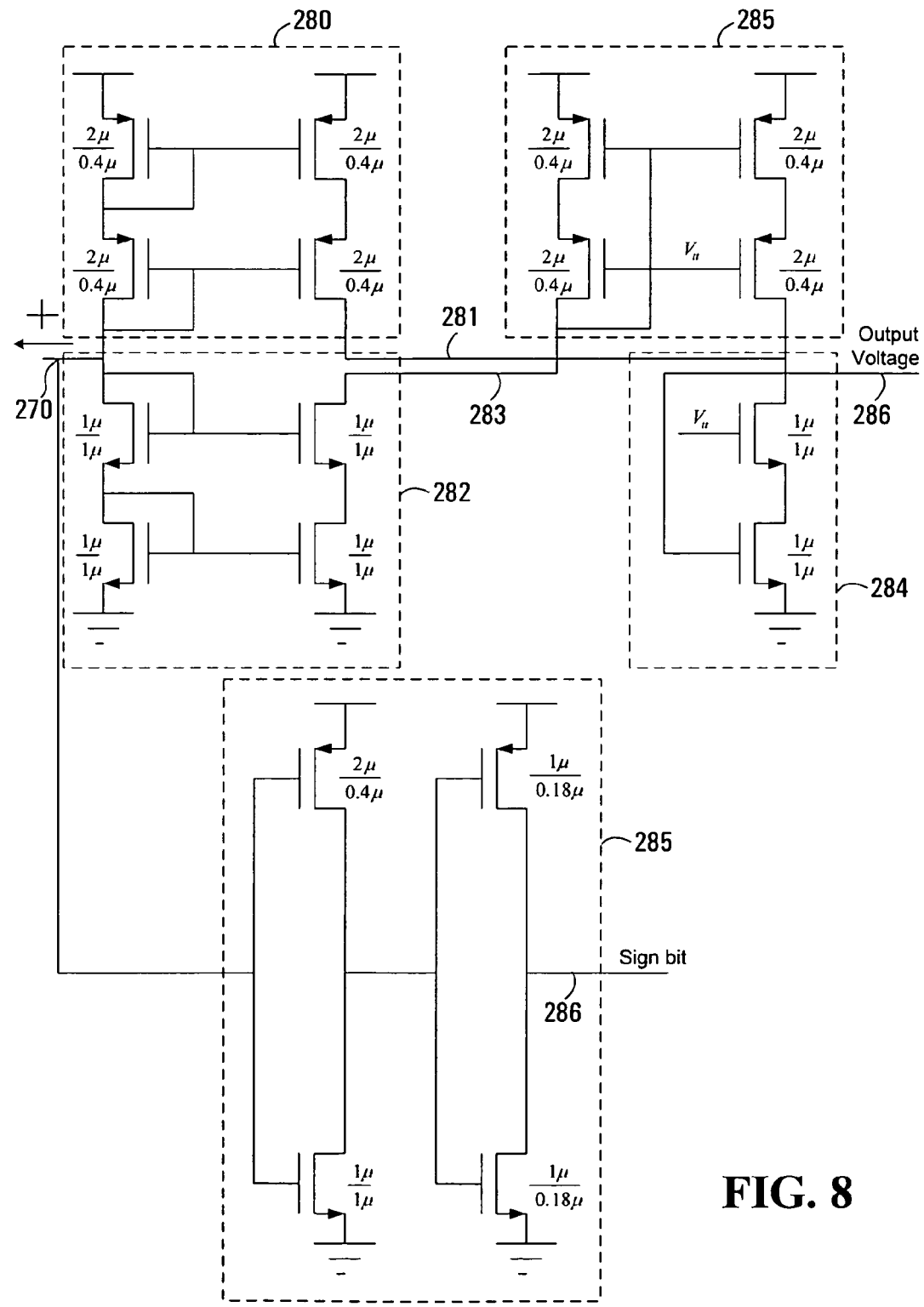
FIG. 8 is a circuit diagram of a real and absolute to sign function provided by an embodiment of the invention.

Referring now to FIG. 8, shown is an example of a R to AS circuit. The circuit consists of a PMOS current mirror 280 and an NMOS current mirror 282 both connected to receive an input 270. The output 283 of the NMOS current mirror 282 is input to a high-swing cascode current mirror 285. The output 281 of the PMOS current mirror 280 is connected to the output of the high-swing cascode current mirror 285 which in turn is connected to a diode-connected circuit 284. The outputs of the PMOS current mirror 281, the high-swing cascode current mirror 285 and the diode-connected circuit 284 are tied together as indicated at 286, this being the output voltage of the circuit. The input 270 is also connected to two NOT circuits connected as indicated generally at 285 in a cascaded arrangement. These circuits together generate a sign bit at 286.

The input current 270, if positive goes to the cascode PMOS current mirror 280 and then is applied to the diode-connected circuit 284, to generate a voltage at 286 corresponding to the current. If the input current 270 is negative and enters the circuit, NMOS cascode current mirror 282 will be active and its output 283 goes to the high-swing cascode current mirror 285 and then is applied to the diode-connected circuit 284 to generate the output voltage 286. To generate the sign of the signal, the voltage at the input wire is compared with the threshold voltage of the NOT circuits 285.

More generally, in other embodiments, any standard CMOS circuit that works as a current rectifier can be used. Also, the output signal could be voltage or current.

Min WTA Circuit

Figure 9:
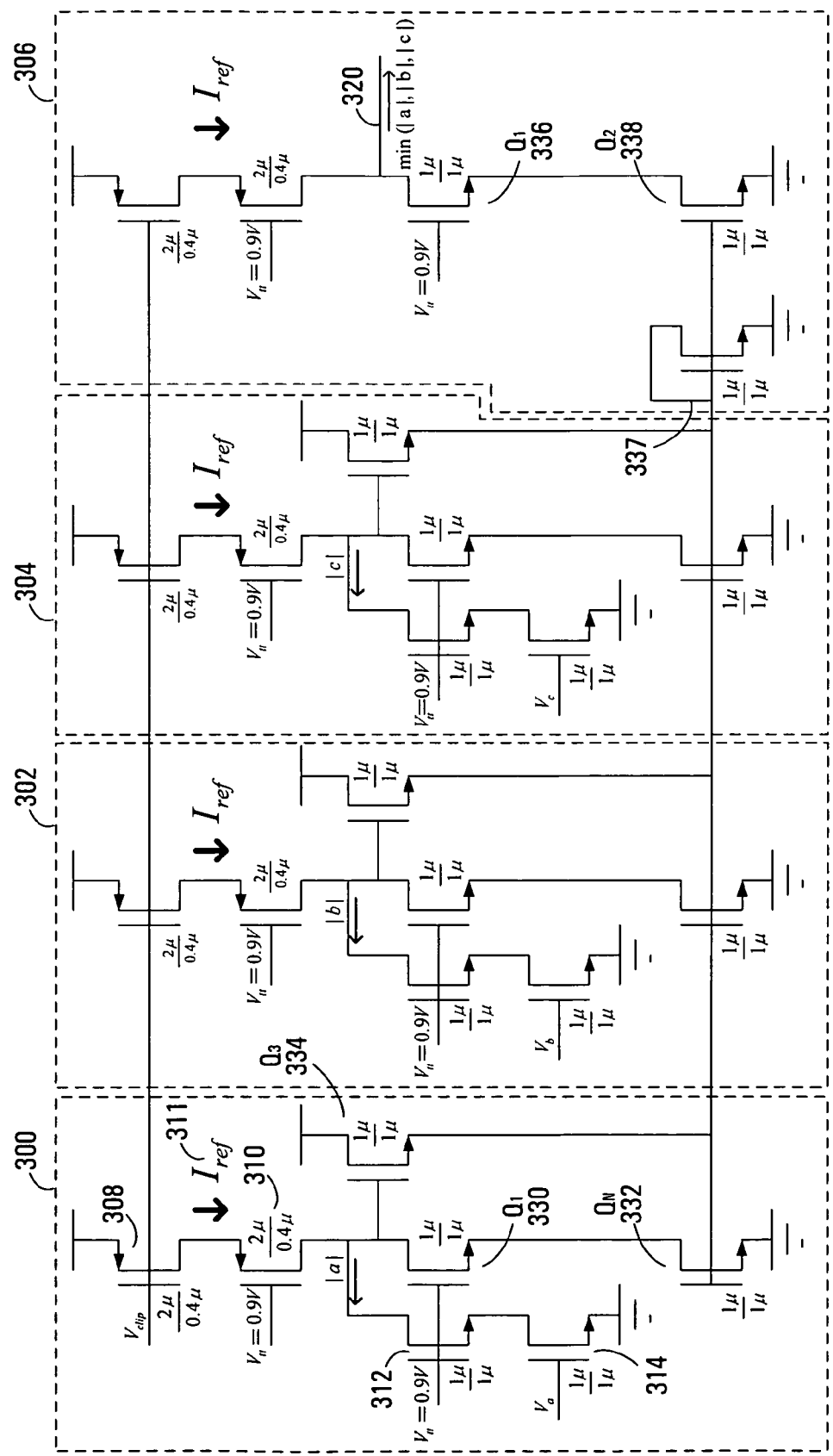
FIG. 9 is a circuit diagram of a minimum winner take all circuit provided by an embodiment of the invention.

Referring now to FIG. 9, shown is an example of a 3-input Min WTA circuit provided by an embodiment of the invention. Each of the three inputs has a respective "cell" 300,302, 304. The three cells are identical, so only cell 300 will be described. There is also an output cell 306. A pair of transistors 308,310 on top of each cell are used to generate a reference current $I_{ref}$ 311 from two fixed biasing voltages. An output voltage corresponding to "|a|" that was generated in the previous block is connected to the gate of transistor 314 and a fixed biasing voltage is applied to 312 transistor's gate. An input current equal to |a| is generated by transistors 312, 314 and is subtracted from $I_{ref}$. Practically the real inputs of the WTA circuit are $I_{ref}$−|a|, $I_{ref}$−|b|, $I_{ref}$−|c|, so the input that is related to the minimum input now would be the maximum current. The remaining transistors are connected as a Max WTA circuit, in itself an embodiment of the invention. The Max WTA circuit has a cascode structure which helps the accuracy of the Max WTA to improve.

For the Max WTA portion of the circuit, each cell has an input stage consisting of two transistors Q1 330 and Q2 332. The input is received at the top of Q1. The gates of all the Q2s are connected together through bleeding transistor 337 to Q2 338 of the output cell 306. Also shown is a feedback transistor Q3 334 connected from the top of Q1 to the common gate voltage of Q2s.

The output cell simply consists of Q1 336 and Q2 338 connected in the same manner as the input cells. The input stages compete to establish the common gate voltage of the Q2s. Once established, the current of the "winning" input stage is reproduced at the output, since the same voltage is applied to the gate of Q2 338.

In the Max WTA portion of the circuit of FIG. 9, the input stages are competing to keep the feedback transistors Q3 on. Eventually, the cell having the maximum input current will be the winner. In brief, cells are trying to establish the shared Q2 gate voltage (the common voltage that is shared between the input cells, and bias the output cell as well). This shared voltage if smaller than what it should be to regenerate the max input current, causes the gate voltage of the feedback transistor in the maximum input cell go up. This in turn increases the amount of current in the feedback transistor and so increases the shared voltage.

If the shared voltage is higher than that suitable value for regenerating the max input current, the gate voltage of the feedback transistor decreases, this however, will reduce the shared voltage and so the shared voltage will be equal to what it should be. Eventually, after settling, the shared voltage will be what it needs to be to sustain a current equal to the maximum input current.

At the overall output 320, the maximum current among $I_{ref}$–|a|, $I_{ref}$–|b|, $I_{ref}$–|c| appears, but before transferring to the output it is subtracted from $I_{ref}$ to produce the minimum current among |a|, |b| and |c|. The example of FIG. 9 shows dimensions, and bias voltages. These are for the purpose of illustration only.

More generally, some sort of min WTA circuit should be used. It could be current-mode or voltage mode.

Figure 10A:
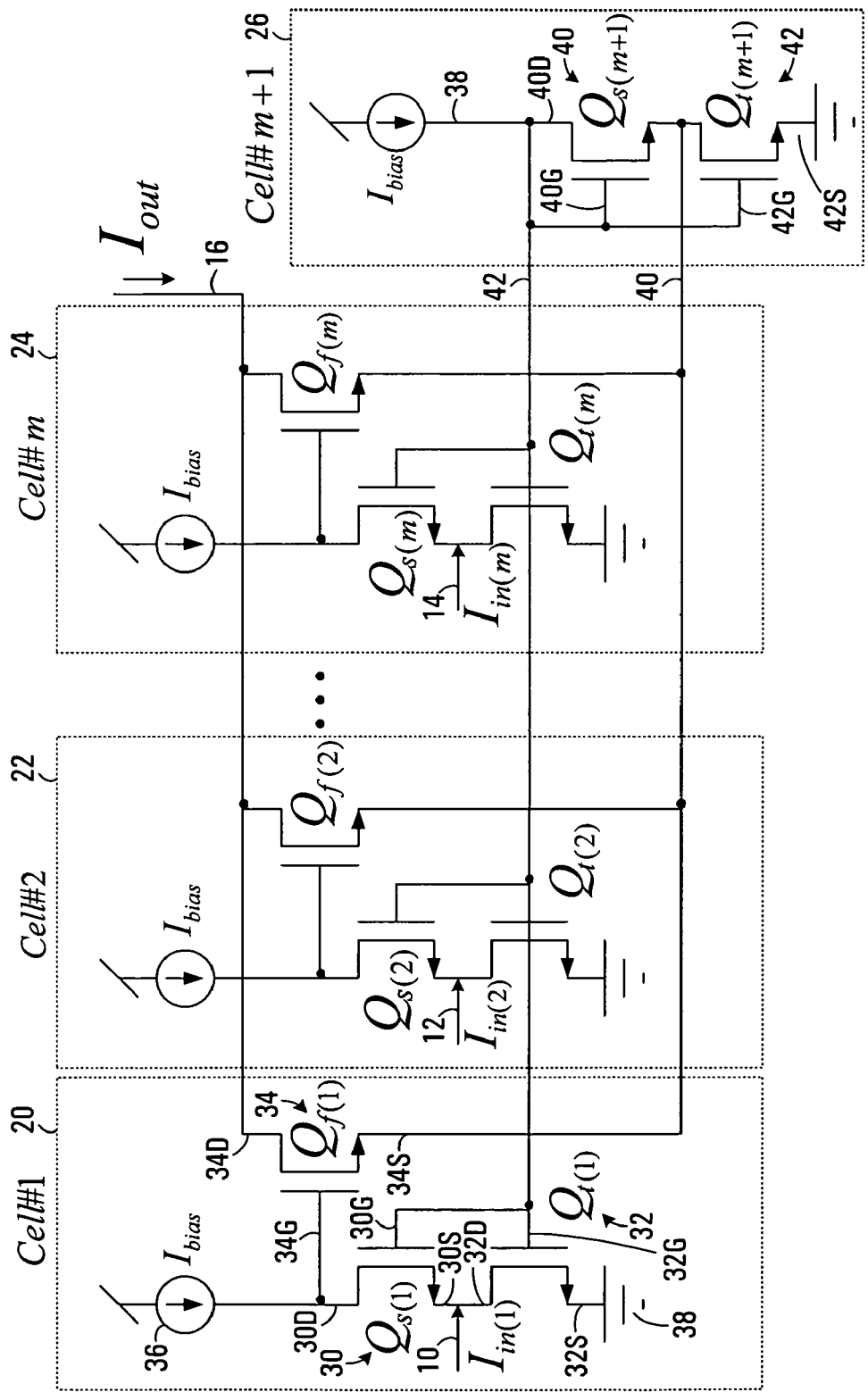
FIG. 10A is a circuit diagram of a maximum winner take all circuit provide by an embodiment of the invention.

Referring now to FIG. 10A shown is another circuit for the maximum winner-take-all (Max WTA) operation provided by another embodiment of the invention which may be used in place of the MAX WTA circuit of FIG. 9 in an iterative analog decoder. The Max WTA circuit may have other applications.

In the low swing cascode circuit of FIG. 9, the voltage requirement at the input is $2V_T+2V_{eff}$ but output voltage could be as small as $2V_{eff}$. For the high swing WTA circuit of FIG. 10A, the input voltage could be as small as $V_{eff}$ and the output also as small as $2V_{eff}$.

Figure 10B:
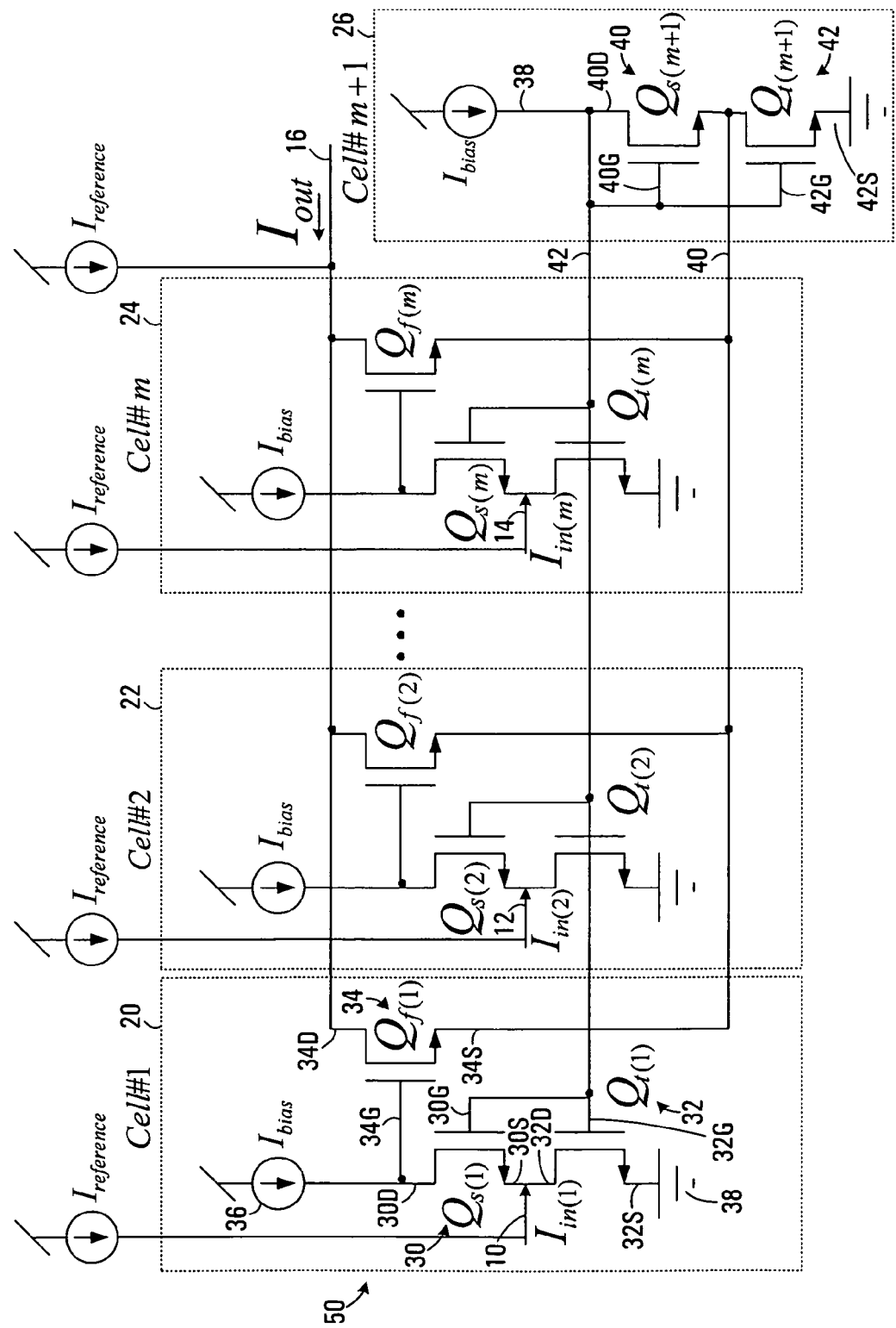
FIG. 10B is a circuit diagram of a minimum winner take all circuit based on the maximum winner take all circuit of FIG. 10A.

A Min WTA circuit based on the Max WTA circuit of FIG. 10A is shown in FIG. 10B. There are m input currents: $I_{in(1)}$ 10, $I_{in(2)}$ 12, ..., $I_{in(m)}$ 14, and an output current $I_{out}$ 16 that is expected to be equal to Max($I_{in(1)}$, $I_{in(2)}$, ... $I_{in(m)}$). Corresponding to each input 10,12,14 there is a cell 20,22,24 with 3 transistors. There is also an "output" cell (cell# m+1) 26 with 2 transistors. The structure of each cell 20,22,24 is identical. The structure of cell 20 will be described by way of example. Shown are three transistors $Q_{s(1)}$ 30 having drain 30D, gate 30G and source 30S, $Q_{t(1)}$ 32 having drain 32D, gate 32G and source 32S and $Q_{f(1)}$ 34 having drain 34D, gate 34G and source 34S. The gates 30G and 32G of transistors $Q_{s(1)}$ and $Q_{t(1)}$ are connected together. The input current $I_{in(1)}$ 10 is applied between source 30S of $Q_{s(1)}$ and drain 32D of $Q_{t(1)}$. The drain 30D of $Q_{s(1)}$ is connected to gate 34G of $Q_{f(1)}$. A bias current 36 is shown applied to the drain 30D of $Q_{s(1)}$ and gate 34G of $Q_{f(1)}$.

The structure of the ith cell is the same, with the transistors being labelled $Q_{s(i)}$, $Q_{t(i)}$ and $Q_{f(i)}$. Transistors with the same index (s, t or f) are identical. The drains of the transistors $Q_{f(i)}$ of all the cells 20,22,24 are connected together to the output 16. The sources of the transistors $Q_{f(i)}$ of all of the cells 20,22,24 are connected together at 40. Also, the gates of the transistors $Q_{t(i)}$ of all of the cells 20,22,24 are connected together at 42.

The output cell 26, has transistors $Q_{s(m+1)}$ 40 having drain 40D, gate 40G and source 40S, $Q_{t(m+1)}$ 42 having drain 42D, gate 42G and source 42S. The gates 40G and 42G of transistors $Q_{s(m+1)}$ and $Q_{t(m+1)}$ are connected together and to the gates of transistors $Q_{t(i)}$ of cells 20,22,24 at 42. The sources of transistors $Q_{f(i)}$ of cells 20,22,24 are connected between source 40S of $Q_{s(m+1)}$ and drain 42D of $Q_{t(m+1)}$. A bias current 38 is shown applied to the drain 40D of $Q_{s(m+1)}$.

The biasing current $I_{bias}$, flowing through each $Q_{s(.)}$ transistor, is fixed. It can be seen that $Q_{s(.)}$ transistors share the same gate voltage and if they operate in saturation, they share the same source voltage too. The $Q_{t(.)}$ transistors always operate in the triode region, since their gate-drain voltages are higher than $V_T$.

As will be shown below, the result of the competition of cells 20,22,24 is a shared gate voltage for $Q_{t(.)}$ and $Q_{s(.)}$ transistors which is imposed by the maximum input current. Cells "compete" to keep their feedback path active ($Q_f(.)$). For the winner cell negative feedback tunes the output current (16) equal to the input current to the cell. It should be noted that the drain voltage of $Q_{t(m+1)}$ and that of the winner transistor(s) are equal since the corresponding $Q_{s(.)}$ transistors are biased in saturation and have the same drain current and consequently have the same source voltages. For the winner $Q_{s(.)}$ transistor(s) to work in saturation, $I_{bias}$ must be chosen properly as will be discussed later. For $Q_{s(m+1)}$, however, this is guaranteed as it has a diode-connected configuration. Having the same gate, source and drain voltages, $Q_{t(m+1)}$ and the winner $Q_{t(.)}$ transistor(s) will have the same drain current regardless of their region of operation (which is in fact triode) and regardless of how nonlinear and complicated the behaviour of the transistors are. As a result, $Q_{t(.)}$ transistors can be built very small or with a high conductance to reduce the voltage requirements at the inputs and the output.

As a result of the winning shared voltage being applied to the output stage, the winner input current is regenerated in output cell as feedback current in $Q_{t(m+1)}$ which is feedback through the $Q_f$ transistor(s) of the winning input cell(s) and appears at the output.

The shared gate voltage pushes all $Q_{t(.)}$ transistors to have the same drain current and consequently for loser inputs, corresponding $Q_{s(.)}$ will have to leave the saturation region and operate in triode region. This will decrease the drain voltage of loser $Q_{s(.)}$ transistors and will push the corresponding $Q_{f(.)}$ to cutoff. Winner $Q_{f(.)}$ transistor(s) inject a current equal to the maximum input current to the drain of $Q_{t(m+1)}$. In fact, a negative feedback is formed by $Q_{s(m+1)}$, $Q_{t(m+1)}$, and the winner $Q_{f(.)}$, $Q_{t(.)}$ and $Q_{s(.)}$ transistors. This adjusts the shared gate voltage of $Q_{t(m+1)}$ and makes its drain current equal to $I_{bias}+I_{max}$.

For the circuit to function properly, $I_{bias}$ is chosen to bias the winner $Q_{s(.)}$ in saturation. Assuming that the k-th input is the winner, then we should have $$V_{gd,Q_{s(k)}} \leq V_T. \tag{6}$$

This along with $$V_{gd,Q_{s(k)}} = V_{gs,Q_{s(m+1)}} - V_{gs,Q_{f(k)}}, \tag{7}$$

results in the condition $$V_{gs,Q_{s(m+1)}} \leq V_T + V_{gs,Q_{f(k)}}. \tag{8}$$

Since $V_{gs,Q_{f(k)}}$ is always greater than $V_T$, this condition will be satisfied if $I_{bias}$ is chosen such that:

$$V_{gs,Q_{s(m+1)}} \leq 2V_T \tag{9}$$

To improve the accuracy of the circuit and to reduce the power consumption, one would like to decrease $I_{bias}$ as much as possible. This however, decreases the speed of the circuit. A compromise has to be made depending on the application.

One can see that the input voltage to the circuit of FIG. 10A can be as low as $V_{eff,Q_t}$, which can be very small since the $Q_{t(.)}$ transistor can be made small with low output impedance. On the other hand, for the output, the minimum voltage is equal to $V_{eff,Q_f} + V_{eff,Q_t}$. Also, since the circuit has a cascode configuration, the output impedance is much larger than that of a single-stage configuration, and can be approximated by:

$$r_{out} \approx g_{Q_f} r_{o,Q_f} (r_{o,Q_{s(m+1)}} \| r_{o,Q_{t(m+1)}}) \tag{10}$$

where $r_o$ and g are the output impedance and the transfer conductance of the transistors, respectively.

In another embodiment, the accuracy can be improved as explained for cell #1 as an example. If 30D and 30G are connected to the inputs of an operational amplifier (op amp) and 34G instead of being connected to 30D is connected to the output of that op amp, the accuracy improves. The reason is this: a complete matching is preferred between $Q_{s(.)}$ and $Q_{t(.)}$ in input cells and Qs(m+1) and Qt(m+1). However, there is a systematic error in the circuit of FIG. 10A. Gate and Drain of Qs(m+1) are connected to each other, while for other Qs(.) this is not the case. Adding the op amp that virtually have the same voltages at inputs improves the accuracy. However, the circuit is slightly more complicated.

Simulation Results

The WTA circuit of FIG. 10A was simulated by Cadence's Spectre simulation tool and 0.13 μm UMC (United Microelectronics Corporation) CMOS models. These results are based on this assumption that there is no mismatch in our circuit. Therefore, the results are too optimistic and in practice we expect lower accuracy. Needless to say, there are quite a few ways for limiting the mismatch problem in real circuits.

Figure 11:
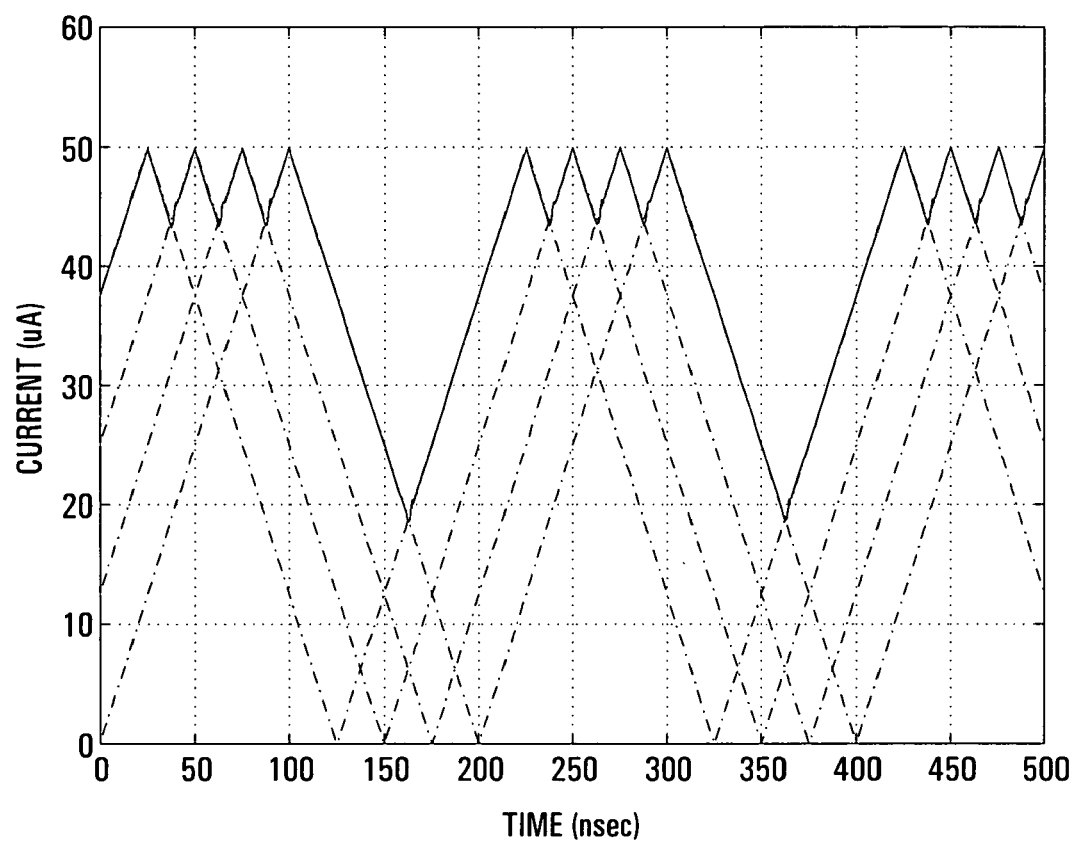
FIGS. 11 and 12 provide performance results for the maximum winner take all circuit of FIG. 10A.

Since an application described is for low-voltage min-sum analog iterative decoders in which the number of inputs is typically small, the simulations considered a Max WTA with four inputs. Four shifted versions of a periodic triangular current source, which has a period of 100 nSec, and varies between 0 and 50 μA, were used as input signals (m=4). Transistor sizes of W/L=600 nm/130 nm, 600 nm/300 nm, and 1 μm/150 nm, were chosen for $Q_{t(.)}$, $Q_{s(.)}$ and $Q_{f(.)}$ transistors, respectively. A supply voltage of 1.2 volts, and a bias current $I_{bias}$ of 10 μA. At the output, the voltage is fixed at 0.3 volts to demonstrate the low-voltage behaviour of the proposed circuit. The input and output currents are shown in FIG. 11. As can be seen, the output current follows the envelope of the maximum input current very closely.

Figure 12:
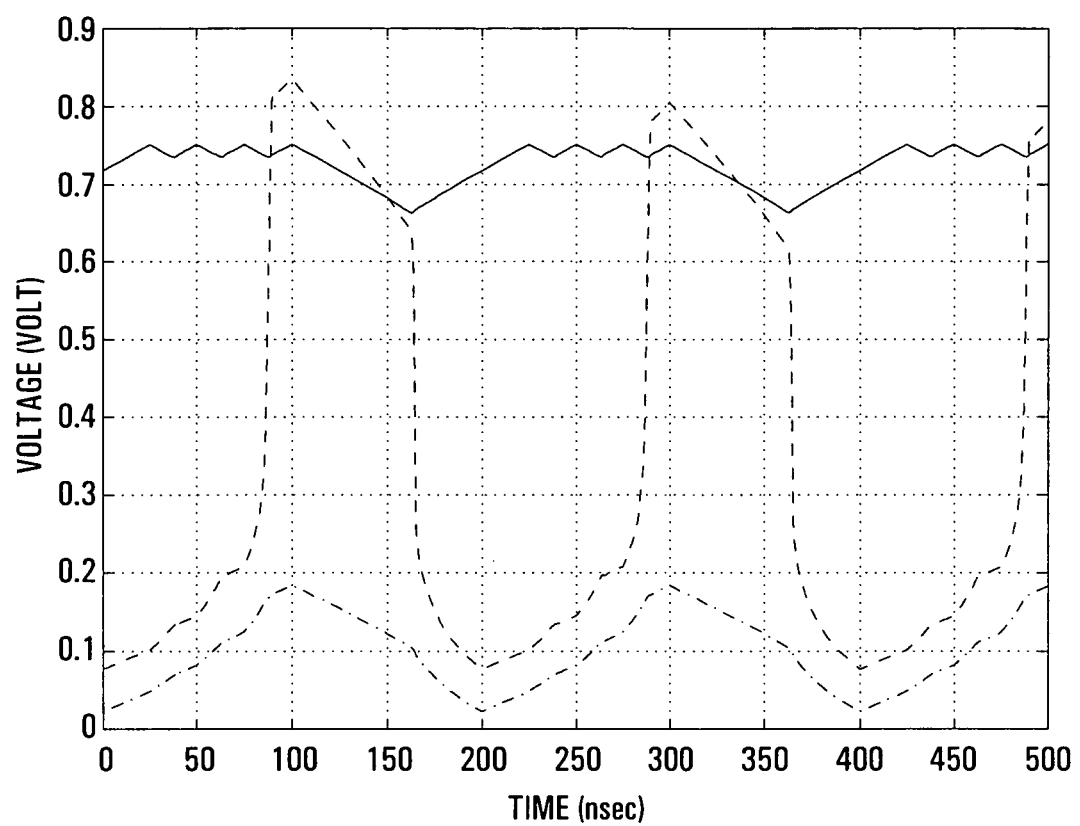

The accuracy when the output current follows one of the inputs is better than 0.1%. This degrades to about 2% when the winner input is changed. This extra degradation, is due to the transient responses of the switched $Q_{f(.)}$ transistors. Voltage variations for the gate of $Q_{t(1)}$ ($V_{gs,Q_{t(1)}}$), the drain of $Q_{t(1)}$ ($V_{ds,Q_{t(1)}}$), and the gate of $Q_{f(1)}$ ($V_{g,Q_{f(1)}}$) are also shown in FIG. 12 where ($V_{gs,Q_{t(1)}}$:———, $V_{g,Q_{f(1)}}$:---, $V_{ds,Q_{t(1)}}$:-.-.). It can be seen that the input voltage requirement for current variations from 0 to 50 μA is very low and is less than 0.2 volts.

Basic operation of winner-take-all circuits depends directly on matching and their accuracy degrades heavily by mismatch. However, mismatch problem is a well-known problem in analog circuit design. Also professional digital designers care about matching of transistor and routes because of skew. There are quite a few ways for constraining mismatch in a circuit. For instance by choosing proper transistor sizing and using common-centroid layout and dummy transistors at the ends of the row, mismatch problem can be limited. Hereinafter, it assumes that there is no mismatch in our circuits to make the problem more tractable. Simulation results, however, may be too optimistic.

Comparisons between New Circuits and Circuits in 2002 Paper

The new approach is different from what presented in 2002 paper. To begin, the messages that are sent back and forth among the processing modules are different; this has a huge impact on the performance of the analog iterative decoder. It is shown that in terms of functionality, circuits in 2002 paper are too primitive. It is also noted that in the 2002 paper, not all necessary modules are presented for implementing a min-sum decoder.

Messages Transmitted between Modules

As it was discussed earlier, in the new implementations, soft information that are either positive, negative or zero are sent back and forth among the processing modules. In page 2 of 2002 paper in 21$^{st}$ Biennial Symposium on Communications, it is stated that "In our circuit design, we use two new variables W and X to represent the message M:

$$W=|M|, X=(\text{sgn}(M)+1)/2.$$

It is then clear that for implementing the CHK computation in (3), one only needs to implement min(.) and binary XOR functions"

The outputs of the variable node in FIG. 3 in this paper are X and W. This shows that a parity-check node (CHK) for each soft information (M) has two inputs, one for the absolute value of the soft information (W) and one for its sign (X).

In contrast, in the new circuits, a single wire represents the soft information. With the previous approach, the number of interconnection would be two times larger. For large codes it is a very important issue since there may be much congestion for routing and any increase in the number of interconnections should be avoided.

While W (absolute value of the soft information (M)) is an analog signal, X is a binary digital signal. Globally distributing digital signals could generate lots of switching noise and the effect of this noise could be more severe when analog sensitive interconnections are close to digital signals, exactly as it is for W and X. In some embodiments of the new circuits, digital signals are just available locally inside the processing modules. This allows mitigation of the switching noise by using a guard ring around these digital circuits, something that was not possible in the previous circuits.

Furthermore, the propagation delay for X and W could be different in practice. Therefore incorrect M could be processed in VAR modules.

Output Impedance

The new designs are based on current mode circuits, so current conveyers play a key role in functionality of our circuits. Conventional current conveyors suffer from low output impedance in short channel transistors. This means that output current of a processing block will change if the output voltage changes. The new circuits strive to have the output current to be independent of the output voltage. The output of a current mode circuit is often modeled by an ideal current source and a resistor (Ro) parallel to that. Any change in the output voltage changes the current flowing through the resistor and consequently changes the output current. Since in these circuits information is expressed in terms of current, this problem can degrade the performance of the circuits and reduce the accuracy. As the transistors shrink in newer technologies, this problem could become more severe as rds (the transistor output impedance) gets smaller.

For the Max WTA circuit presented in 2002 paper, the output impedances are equal to the output impedance of the transistor (rds). For the new Min WTA circuits of FIGS. 9 and 10B, the output impedance is proportional to the square of rds, so it is much higher and consequently the related circuits are more accurate.

It may be possible to get good performance from the circuits in the 2002 paper by increasing the length and width of the transistors. Increasing the length of the transistors significantly improves the output impedance. However, the overall size of the transistor will increase and therefore big codes can not be implemented in this way (lower integrity level).

Swing Voltage: (High Swing Module Versus Low Swing Modules)

Preferably, the analog decoders are implemented with the same technology that is used for digital circuits. It is desirable to have the same supply voltages for these circuits; otherwise separate voltage sources should be available. Having different supply voltages is a drawback that could increase the overall expense but this is not prohibitive. The supply voltage gets smaller and smaller in new technologies, for instance in 0.18 µm standard digital CMOS technology the supply voltage is 1.8 volts and in 0.13 µm standard digital CMOS technology the supply voltage is just 1.2 volts. Design of analog circuits for reduced supply voltages is quite tricky. In the circuits of the 2002 paper to get good output impedances, the output impedance of the transistors can be increased for example by using larger transistors as described above. However, this will eventually cause a considerable amount of voltage drop on the transistors and if the supply voltage is small then there might not be enough room for voltages to swing. This limits the dynamic range of the current and pushes it towards zero.

Comparisons between New WTA Circuits and WTA Circuits in Baturone Paper

Apart from the clear physical differences between these presented circuits for min WTA and the circuits of the above-referenced Baturone paper include differences in swing voltage at the input and the output. In that paper, the minimum input voltage is equal to $2VT+2Veff$ and output voltage should be at least $VT+2Veff$, where VT is the transistor threshold voltage, and Veff the effective voltage. The swing of this circuit consists of the allowed voltages from these values to Vdd, the power supply voltage. In the "low swing" cascode circuit (FIG. 9) the voltage requirement at the input is $2VT+2Veff$ but the output voltage could be as small as $2Veff$ meaning that the voltage swing is $Vdd-2Veff$. So even the so-called low swing circuit has a high swing on the output, substantially higher swing than that cascode WTA in the literature. For the "high swing" WTA circuit (FIG. 10A), the input voltage could be as small as Veff and output is as small as $2Veff$ meaning that the swing is $Vdd-2Veff$, so both the input and output are high swing.

Two circuits having high swing at the output have been presented. More generally, in other embodiments of the iterative decoder, other high swing cascode-based min WTA circuits may be employed.

More generally, a min WTA circuit is provided which has a common high swing output stage and a plurality of input stages each having a respective feedback path, the feedback paths competing to establish a shared voltage. The shared voltage is applied to the output stage to produce the winning current. The term "high swing" in this context is well understood by those in the art. For example, typically if the minimum output voltage includes a VT term, it is not considered a high swing output stage. Preferably, the output resistance is also large. A circuit having output resistance of Rds, the output resistance of a single transistor, is typically not considered to have a large output resistance. In cascode output stages, the output resistance is typically proportional to $Rds^2$, and this is considered large in most contexts.

In summary, for technologies beyond 0.18 µm only the new circuits will remain functional. For 0.18 µm technology and 1.8 volt supply the new circuits would work, but the circuits in 2002 paper would have many problems. In the simulations in that paper, a supply voltage equal to 3.3 volts that can be used in 0.18 CMOS technology was used, but is not desirable in practice as was explained earlier.

Simulations

Figure 13:
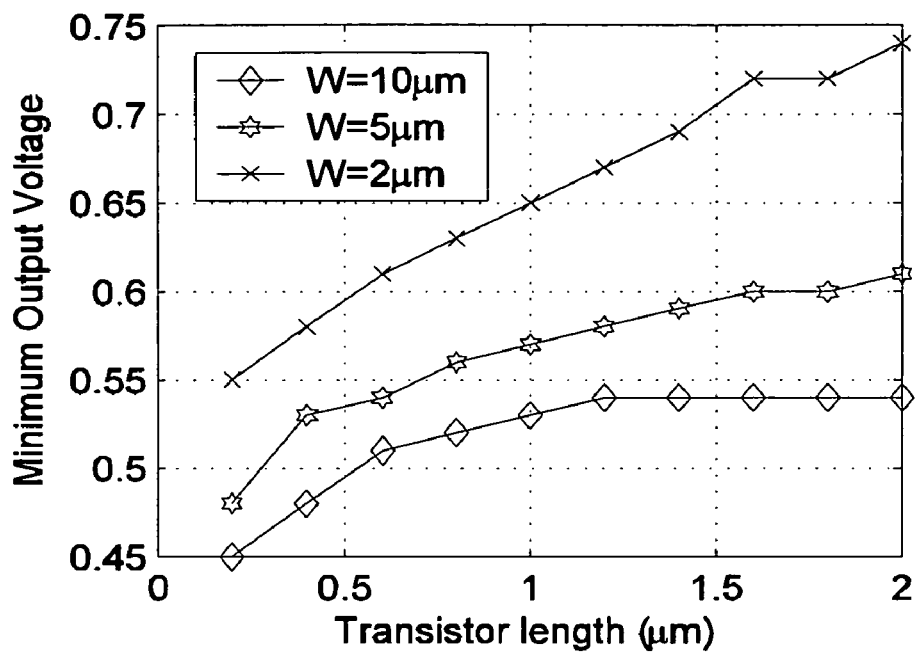
FIGS. 13-16 provide performance results for a known winner take all circuit.
Figure 14:
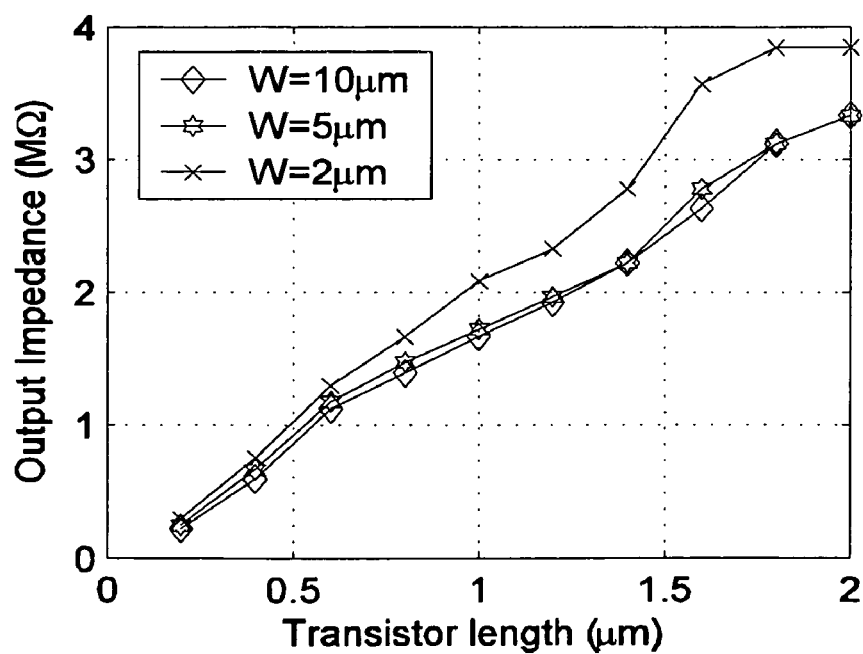
Figure 15:
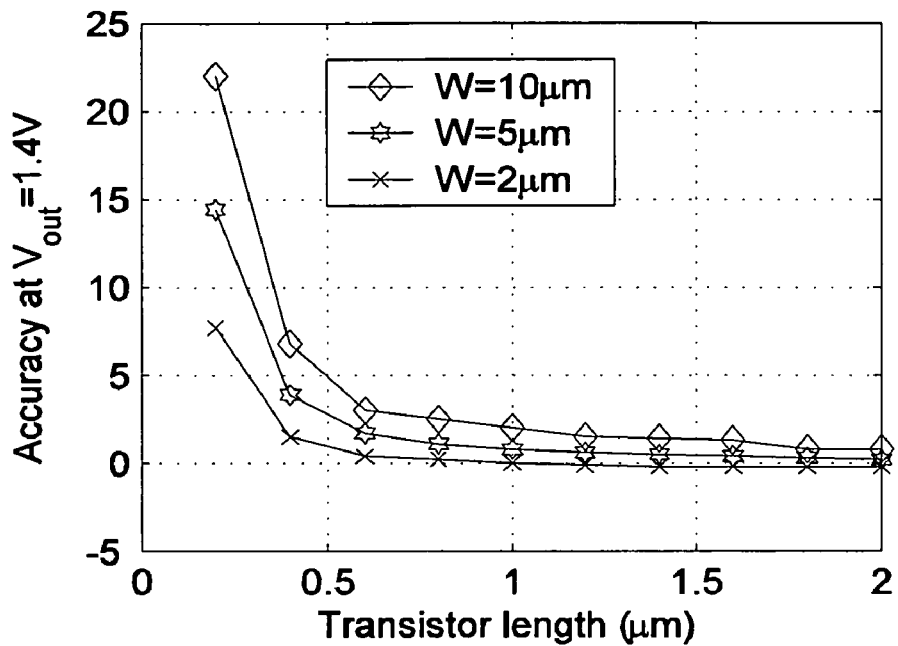
Figure 16:
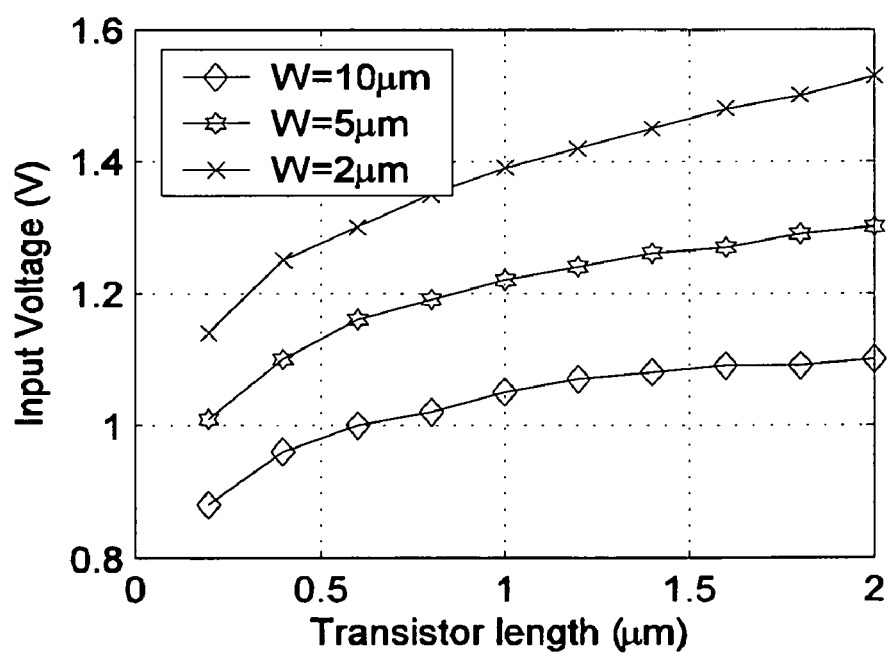

In order to clarify the problems with the circuits of the 2002 paper, simulations were performed using Cadence spectre toolbox and 0.18 CMOS technology and a supply voltage of 1.8 volts. For the winner-take-all circuit presented in the 2002 paper, it was assumed the winner current is equal to 10 µA and width of the transistors was set to values of 2, 5 and 10 µm for respective simulations and the length was changed from 0.2 to 2 µm. The minimum necessary voltage at the output (FIG. 13) is always less than 0.75 volt, so there is no swing problem at the output. The output impedance (FIG. 14) higher than 2M can be considered good. FIG. 15 shows the corresponding accuracy. However, input voltages (FIG. 16) are high and for the case when width of the transistor is 2 um, it does not have that much swing. For W=10 um, the input voltage is fine but the size of transistor is 20 $um^2$, and that is large compared to sizes possible with the new circuits.

Two new Min WTA circuits have been described, one with high-swing and the other one with low-swing. Minor modifications to the circuits can be made to implement clipped min-sum, normalized min-sum, min-sum with conditional or unconditional correction. In clipped min-sum the maximum of the messages are bounded. In normalized min-sum outgoing messages are scaled properly in each iteration. In conditional or unconditional correction the outgoing messages from CHK nodes are corrected by subtracting it by a fixed or variable number, respectively. All these modification can be easily applied to the described circuits.

AS to R Circuit

Figure 17A:
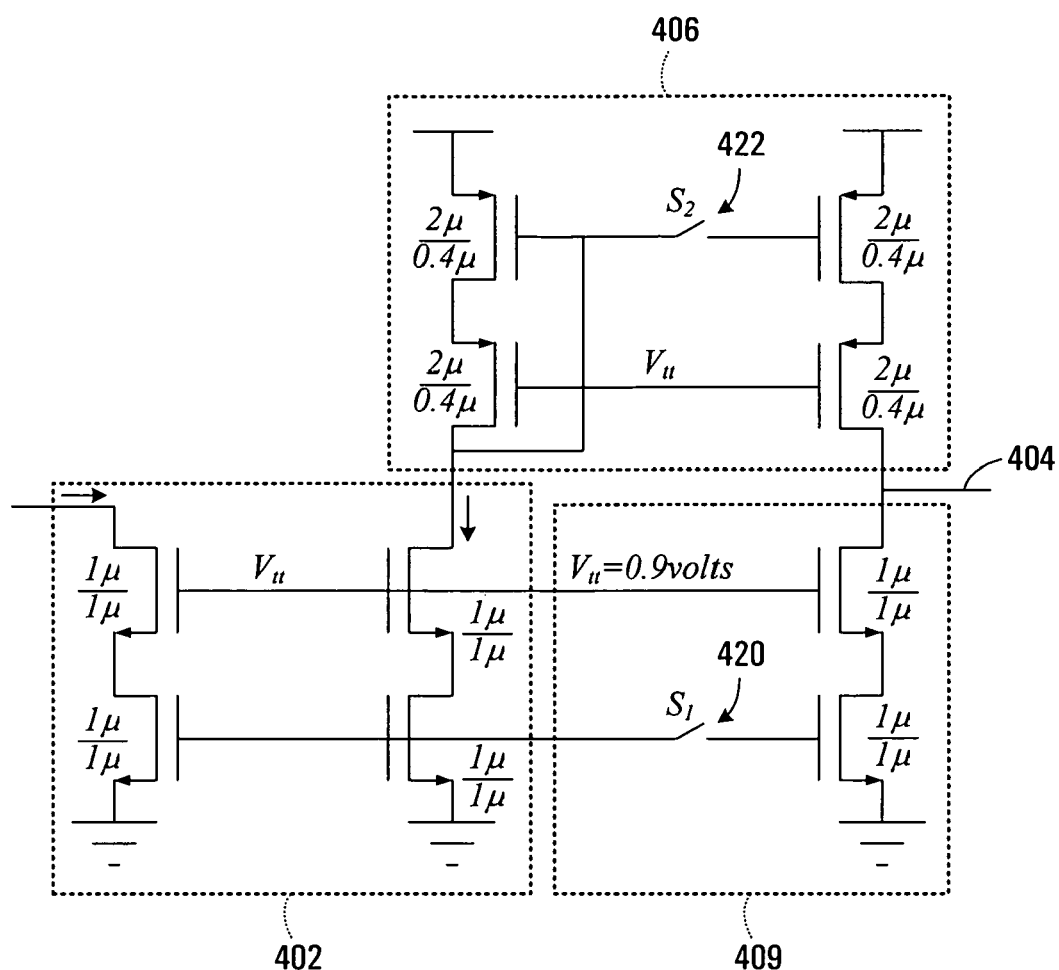
FIG. 17 is a circuit diagram of an example absolute and sign to real conversion circuit provided by an embodiment of the invention.
Figure 17B:
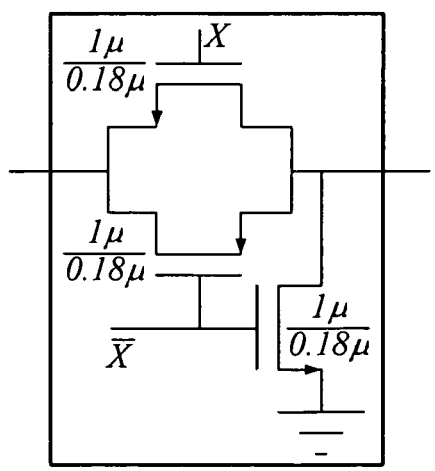
Figure 17C:
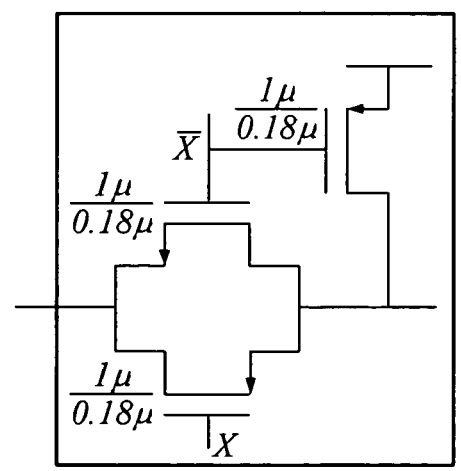

The AS to R circuit is the output stage of the CHK node. An example implementation is shown in FIG. 17. The current Y 400 that comes out of the WTA circuit, and sign X 402 that is generated by XOR circuit are conducted to this module to make a bilateral current 404 that represents the soft information. The circuit has a PMOS current mirror 406 connected above an NMOS current mirror 408 and an additional output stage 409 of the NMOS current mirror 408. There is a switch 420 between the two output stages of the NMOS current mirror 408, and there is a switch 422 between the input and output stages of the PMOS current mirror 406.

In practice, if X inside S1 switch 400 is 1 (1.8 Volts), then the analog switch inside S1 switch is on and the S1 switch acts as a short circuit and the input current transfers to the output through the NMOS current mirror 408 and the additional output stage 409. When X is 1, S2 switch 422 is open circuit and PMOS current mirror is not active. When X is 0, S1 switch 420 is open circuit and the input current appears at the output by passing through the PMOS current mirror. Needless to say depending on which switch (S1 or S2) is short circuit, the direction of the current at the output would be different.

Figure 18:
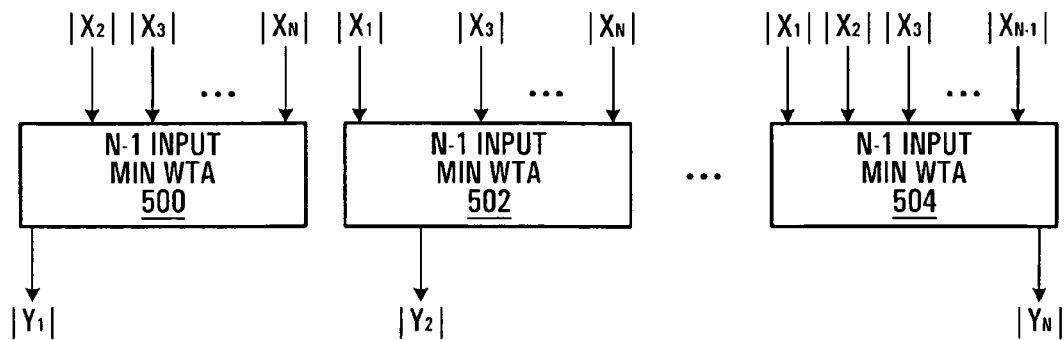
FIG. 18 is a block diagram of a min WTA implementation suitable for high degree applications provided by an embodiment of the invention.
Figure 18:
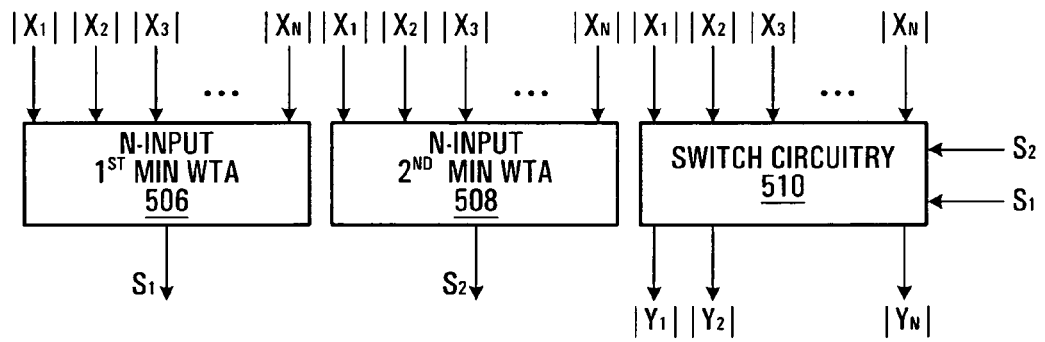

In another embodiment, a novel winner take all structure is provided which may be used in the above-discussed iterative decoders, but which may find application elsewhere. This embodiment is particularly suited for winner take all implementations having a large number of inputs. Referring to FIG. 18, if a CHK module (and as such the corresponding min WTA blocks) has n inputs, the normal approach is to construct n min WTA blocks 500,502,504 (only three shown) each of which has n−1 inputs and produces an output equal to the minimum of the respective n−1 inputs. In this embodiment, rather than providing n min WTA blocks, a single min WTA block 506, a single $2^{nd}$ min WTA block 508 and switch circuitry 508 are employed. The single min WTA block 506 determines the overall minimum for all n inputs. The single $2^{nd}$ min WTA block determines the overall second minimum of the n inputs. The overall minimum and the second overall minimum can be used to generate all of the required outputs. Looking at the block diagram of a CHK module (elements 500,502,504), if "a" is the $1^{st}$ min and "b" is the $2^{nd}$ min, the first output, corresponding to "a" has the absolute value equal to "|b|" and all other outputs have the absolute value equal to "|a|". Therefore, employing only the first and second min WTA circuits 506,508 substantially simplifies the circuit.

Figure 19:
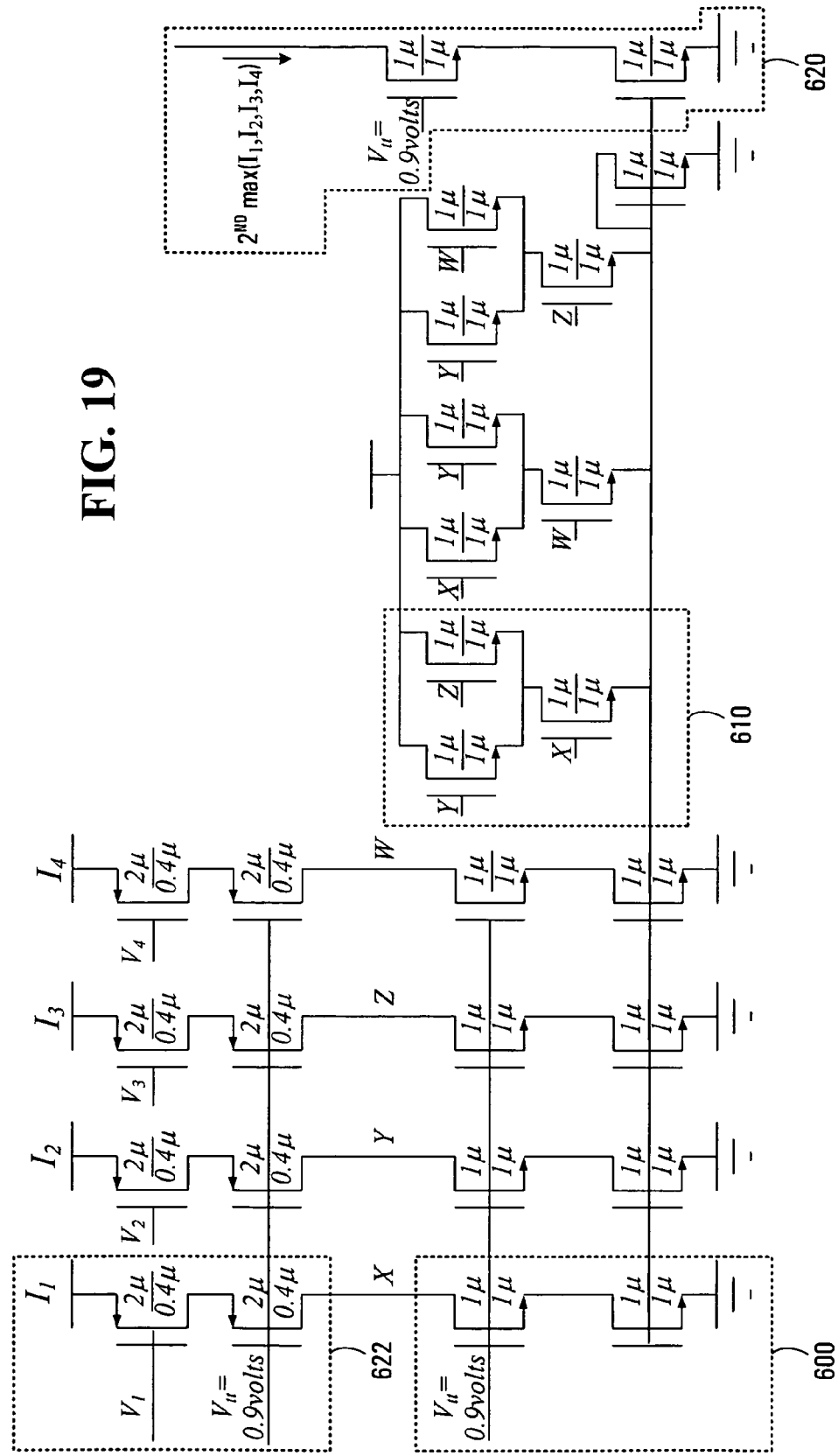
FIG. 19 is a circuit diagram of a $2^{nd}$ min WTA circuit provided by an embodiment of the invention that can be used in the embodiment of FIG. 18.

A $2^{nd}$ min WTA circuit can be produced from a min WTA circuit by changing the feedback circuit. An example of a high swing $2^{nd}$ min circuit provided by an embodiment of the invention is shown in FIG. 19. The concept of a $2^{nd}$ min WTA circuit was taught in I.E. Opris, "Analog rank extractors and sorting networks", Ph.D. dissertation, Stanford Univ. Stanford Calif., 1996. No high swing circuits were taught however. This particular $2^{nd}$ min WTA circuit can be employed in the block diagram of FIG. 18. However, it is to be clearly understood that other $2^{nd}$ min WTA circuits may alternatively be employed for this embodiment.

As it was described earlier, in a WTA circuit, competition among input cells aims to keep the feedback path open (like short circuit, not open circuit). For a 2nd min WTA circuit, the input and output cells can be exactly same as any of the embodiments described for a WTA circuit. The circuit of FIG. 19 shows input and output cells which are the same as the WTA circuit of FIG. 9. One input cell is indicated at 600 by way of example. Since this is a $2^{nd}$ max WTA circuit, the reference currents of FIG. 9 are not needed. However, if a $2^{nd}$ min WTA circuit were to be made, the reference currents would be employed. The input current $I_1$ is generated by the top two transistors of 622. It is noted that in this and any of the other circuits presented, input currents may be generated from voltages using an appropriate voltage controlled current source.

The feedback paths for the circuit of FIG. 19 are different from the feedback paths of FIG. 9. One set of feedback paths is indicated at 610 and consists of two transistors in parallel connected in series with a third transistor. The labels "X", "Y" and "Z" represent interconnections to like labelled points in the input cells, these interconnections not being shown in the interest of simplifying the Figure. In this case, a feedback path will not be open unless the gate voltages of two feedback transistors in series are high at the same time (in the min WTA it was enough to have just one transistor active). This is because the feedback paths consist of two transistors on top of each other. If these transistors are looked at as simple switches, the structure of the feedback path looks like two serial switches. To keep the feedback path open (short circuited), both switches should be open (short circuit) simultaneously. Again the behaviour of the circuit can be explained by considering the shared voltage. If the shared voltage is smaller than what it should be to cause the second winner to appear at the output, the voltage at the top of the $2^{nd}$ winner input cell goes up, providing more current through the feedback path and increasing the shared voltage. If this voltage is higher than that, the voltage at the top of the 2nd winner input cell comes down and consequently less current is injected in the feedback path and the shared voltage is reduced. In the 1st winner cell in a 2nd WTA circuit, since the shared voltage does not let the winner cell have a current equal to its input, the voltage on top of the winner cell goes towards Vdd and opens the related feedback transistor, but that feedback transistor by itself can not open the feedback path. Another feedback transistor needs to be open too. When the voltage on top of the $2^{nd}$ winner cell is enough to keep the related feedback transistor active, negative feedback is established and keep the system stable and fixes the shared voltage. The feedback paths 610 include a feedback path for the combination of inputs YX and ZX. Collectively, there is a feedback path for each combination of two inputs.

FIG. 19 is a specific example of a $2^{nd}$ max WTA circuit. For an N input WTA circuit, to generate a $2^{nd}$ max WTA, a feedback path for each permutation of two inputs needs to be provided. Thus, the number of paths needed would be N(N−1)/2, and the number of transistors to implement a separate path for each permutation would be 2×N(N−1)/2=N(N−2). However, the feedback paths can be combined, as in the example of FIG. 19 where the path for YX and ZX both share a common X input transistor. The order of the transistors in a given feedback path is not important. This can be used to substantially decrease the number of transistors below the N(N−1)/2 maximum.

The same changes to the feedback path can be made to any other max WTA circuit provided by the invention to produce a $2^{nd}$ max WTA circuit.

Many of the circuits presented employ specific current mirrors. Other current mirrors may alternatively be used. Preferably, current mirrors are selected so as to have improved output resistance compared to simple current mirrors having output resistance Rds. Preferably, the current mirrors employed feature a cascode structure. However, in some embodiments of the iterative decoder, this may not be the case.

Numerous modifications and variations of the present invention are possible in light of the above teachings. It is therefore to be understood that within the scope of the appended claims, the invention may be practiced otherwise than as specifically described herein.

For example, while specific variable nodes and check nodes have been presented, more generally, any standard CMOS implementation of a min sum analog decoder having check and variable nodes interconnected to exchange real valued messages is contemplated by another embodiment of the invention. The actual functions implemented by the variable nodes and check nodes may differ.

New current mode min WTA circuits have been provided. For the iterative analog decoder, these or other min WTA circuits may be employed. For example, voltage mode WTA circuits may be employed.

We claim:

1. An analog min-sum iterative decoder comprising:

a plurality of standard CMOS variable nodes and a plurality of standard CMOS check nodes, the variable nodes and the check nodes being interconnected with a plurality of interconnections in accordance with a code to be decoded;

wherein real-valued messages are passed on each interconnection between one of said variable nodes and one of said check nodes;

wherein each standard CMOS check node comprises:

a respective real to absolute and sign function for each input to the check node, the real to absolute and sign function producing a respective absolute value output and a respective sign output;

for each input to the check node:

a respective minimum WTA function connected to receive absolute value outputs of the real to absolute and sign functions other than the absolute value output respective the input, adapted to produce a minimum WTA output which is a minimum of the absolute value inputs;

a respective XOR function connected to receive sign outputs of the real to absolute and sign functions other than the sign output respective the input, adapted to produce a sign output;

an absolute and sign to real converter connected to receive the minimum WTA output and the sign output, adapted to produce a real valued output.

2. An analog min-sum iterative decoder according to claim 1 wherein each interconnection between one variable node and one check node comprises a first line from the variable node to the check node conveying a first real valued message, and a second line from the check node to the variable node conveying a second real valued message.

3. An analog min-sum iterative decoder according to claim 1 wherein each interconnection between one variable node and one check node comprises a first pair of lines from the variable node to the check node conveying a first differential real valued message, and a second pair of lines from the check node to the variable node conveying a second differential real valued message.

4. An analog min-sum iterative decoder according to claim 2 wherein each check node and each variable node has an output impedance substantially greater than an Rds of a single transistor in an output stage of the check node or variable node.

5. An analog min-sum iterative decoder according to claim 2 wherein each check node and each variable node has a high swing output stage.

6. An analog min-sum iterative decoder according to claim 2 wherein each check node and each variable node has an output stage allowing a swing at least between 2Veff and Vdd, where Veff is an effective gate voltage and Vdd is a power supply voltage.

7. An analog min-sum iterative decoder according to claim 2 further comprising shielding and/or guard rings around any digital circuits and digital interconnections within check nodes or variable nodes to reduce effects of switching noise.

8. An analog min-sum iterative decoder according to claim 1 wherein each real to absolute and sign function for each input to the check node comprises:
 a PMOS current mirror and an NMOS current mirror each connected to receive the input;
 a high swing cascode current mirror having an output connected to a diode connected circuit;
 wherein an output of the NMOS current mirror is connected to an input of the high swing cascode current mirror, and an output of the NMOS current mirror is connected to the output of the high swing cascode current mirror;
 a sign conversion circuit connected to receive the input and produce a sign output.

9. An analog min-sum iterative decoder according to claim 1 wherein each minimum WTA function comprises:
 a maximum WTA function comprising:
 a common high swing output stage;
 a plurality of input stages each having a respective feedback path, the feedback paths competing to establish a shared voltage so as to produce a winning current in the common high swing output stage substantially equal to the maximum input current.

10. An analog min-sum iterative decoder according to claim 9 wherein the minimum WTA function has an output resistance at least on the order of $Rds^2$.

11. An analog min-sum iterative decoder according to claim 9 wherein the shared output stage has a cascode structure.

12. An analog min-sum iterative decoder according to claim 9 further comprising:
 a plurality of reference current sources for realizing the minimum WTA function from the maximum WTA function.

13. An analog min-sum iterative decoder according to claim 9 wherein in each max WTA circuit:
 for each input stage:
 a) the input stage comprises a cascode structure with an input current being input at a first end of the cascode structure, and with the shared voltage being connected to a gate of a transistor at a second end of the cascode structure;
 b) the respective feedback path comprises a connection from the top of the cascode structure through a feedback transistor to a point at which said shared voltage is established;
 the common high swing output stage comprises a cascode structure substantially similar to the cascode structure of the input stages, wherein an output current is produced at a first end of the cascode structure as a result of the shared voltage being connected to a gate of a transistor at a second end of the cascode structure.

14. An analog min-sum iterative decoder according to claim 13 wherein the output stage comprises a bleeding transistor to which said shared voltage is applied.

15. An analog min-sum iterative decoder according to claim 9 wherein in each max WTA circuit:
 each input stage comprises a cascode structure with an input current being input between a first transistor and a second transistor of the cascode structure, and with the shared voltage being connected to gates of the first and second transistors;
 the output stage comprises a cascode structure having an output between a first transistor and a second transistor of the cascode structure at which a feedback current is produced, with the shared voltage being connected to gates of the first and second transistors;
 each input stage has a respective feedback path comprising a connection from the top of the cascode structure through a gate of a feedback transistor, the feedback transistor being connected to the input of the output stage;
 wherein the input stages compete to establish the shared voltage which is applied to the output stage to produce the feedback current substantially equal to the maximum input current, and the feedback current is applied through the feedback transistor(s) of the winning input stage(s) to produce an output current.

16. An analog min-sum iterative decoder according to claim 1 wherein each absolute and sign to real converter receives an absolute input and a sign input, and the absolute and sign to real converter comprises:
 an NMOS current mirror having two output stages, the NMOS being connected to receive the absolute input, and a PMOS current mirror having an input stage and an output stage, the PMOS current mirror being connected above the two output stages of the NMOS current mirror;
 a first switch between the two output stages of the NMOS current mirror;
 a second switch between the input and output stages of the PMOS current mirror;
 wherein the first and second switches have opposite states controlled by the sign input such that either the output stage of the NMOS current mirror is active, or the second output stage of the PMOS current mirror is active.

17. An analog min-sum iterative decoder comprising:
 a plurality of standard CMOS variable nodes and a plurality of standard CMOS check nodes, the variable nodes and the check nodes being interconnected with a plurality of interconnections in accordance with a code to be decoded;

wherein real-valued messages are passed on each interconnection between one of said variable nodes and one of said check nodes;

wherein each analog standard CMOS check node comprises:

a respective real to absolute and sign function for each input to the check node, the real to absolute and sign function producing a respective absolute value output and a respective sign output;

a minimum WTA function connected to receive absolute value outputs of all of the real to absolute and sign functions, adapted to produce a minimum WTA output which is a minimum of the absolute value inputs;

a second minimum WTA function connected to receive absolute value outputs of all of the real to absolute and sign functions, adapted to produce a second minimum WTA output which is a second minimum of the absolute value inputs;

switching circuitry adapted to select either the minimum WTA output or the second minimum WTA output as a respective min WTA output for each input;

for each input:

a respective XOR function connected to receive sign outputs of the real to absolute and sign functions other than the sign output respective the input, adapted to produce a sign output;

an absolute and sign to real converter connected to receive the respective minimum WTA output and the sign output, adapted to produce a real valued output.

18. An analog min-sum iterative decoder comprising:

a plurality of standard CMOS variable nodes and a plurality of standard CMOS check nodes, the variable nodes and the check nodes being interconnected with a plurality of interconnections in accordance with a code to be decoded;

wherein real-valued messages are passed on each interconnection between one of said variable nodes and one of said check nodes;

wherein each variable node has at least one check node input each from a respective check node and a has decoder input, and each variable node has a corresponding check node output for each check node input and has a decoder output, the variable node comprising:

for each input, a respective input current buffer converting a sign of the input to produce a negative input, each input current buffer having a respective first input current buffer output stage;

a sum current buffer connected to receive a sum of negative inputs produced by the input current buffers to produce a sum current equal to a sum of the inputs, the sum current buffer having a first sum current buffer output stage;

a sign detecting circuit connected to determine the sign of the sum current, the sign of the output being the decoder output;

for each check node output:

a respective sum current buffer output stage of which said first sum current buffer output stage may be one, adapted to produce/reproduce the sum current output;

a second input current buffer output stage connected to the respective input current input stage and adapted to produce a replica of the negative input current;

a respective real valued output for the check node output being produced by adding the sum current output to the replica of the negative input current.

19. An analog min-sum iterative decoder according to claim 18 wherein:

each input current buffer comprises a PMOS current mirror and an NMOS current mirror connected to receive the input and to generate the negative input.

20. An analog min-sum iterative decoder according to claim 18 wherein:

the sum current buffer comprises a PMOS current mirror and an NMOS current mirror connected to receive the sum of the negative input currents and to produce sum current output.

21. An analog min-sum iterative decoder according to claim 18 each sign detecting circuit comprises a pair of NOT circuits connected consecutively.

* * * * *